(12) United States Patent
Sugita

(10) Patent No.: US 7,003,031 B1
(45) Date of Patent: Feb. 21, 2006

(54) PULSE WIDTH MODULATING DEVICE AND EXPOSURE DEVICE

(75) Inventor: Yukio Sugita, Kanagawa (JP)

(73) Assignee: Fuji Photo Film Co., Ltd., Kanagawa (JP)

(*) Notice: Subject to any disclaimer, the term of this patent is extended or adjusted under 35 U.S.C. 154(b) by 0 days.

(21) Appl. No.: 09/556,821

(22) Filed: Apr. 21, 2000

(30) Foreign Application Priority Data

Apr. 23, 1999 (JP) .............................. 11-115924

(51) Int. Cl.
*H03K 7/08* (2006.01)
*H03K 9/08* (2006.01)

(52) U.S. Cl. ........................ 375/238; 375/237; 375/239
(58) Field of Classification Search ................ 375/238, 375/259, 239; 359/184–186; 332/109
See application file for complete search history.

(56) References Cited

U.S. PATENT DOCUMENTS

| 4,658,225 | A | * | 4/1987 | Dukes et al. ................ 333/166 |
| 5,428,321 | A | * | 6/1995 | Yoshida et al. ............. 332/109 |
| 5,502,419 | A | * | 3/1996 | Kawasaki et al. ........... 332/109 |
| 5,583,552 | A | * | 12/1996 | Mutoh ......................... 347/80 |
| 5,880,644 | A | * | 3/1999 | Schmidt et al. ............. 332/109 |
| 5,940,101 | A | * | 8/1999 | Mutoh ......................... 347/78 |
| 5,963,107 | A | * | 10/1999 | Nagano et al. ............. 332/109 |
| 5,991,041 | A | * | 11/1999 | Woodworth ................ 356/602 |
| 6,011,533 | A | * | 1/2000 | Aoki ............................ 345/92 |
| 6,137,577 | A | * | 10/2000 | Woodworth ................ 356/623 |
| 6,390,579 | B1 | * | 5/2002 | Roylance et al. .............. 347/9 |
| 6,512,534 | B1 | * | 1/2003 | Koga .......................... 347/249 |

* cited by examiner

*Primary Examiner*—Jay K. Patel
*Assistant Examiner*—Qutub Ghulamali
(74) *Attorney, Agent, or Firm*—Sughrue Mion, PLLC

(57) ABSTRACT

A PWM signal is made to rise synchronously with a pixel clock by inputting of a pulse to a set terminal (S terminal) of an R-S flip-flop. One of a reference clock, which is generated by a reference clock generator, and a delay clock, which is obtained by a delay circuit delaying the reference clock, is selected in accordance with delay selection data. The PWM signal is made to fall synchronously with a selected clock.

4 Claims, 16 Drawing Sheets

PULSE WIDTH MODULATING DEVICE AND EXPOSURE DEVICE

BACKGROUND OF THE INVENTION

1. Field of the Invention

The present invention relates to pulse width modulating device and an exposure device, and in particular, to a pulse width modulating device which can generate pulse width modulating signals having a high bit resolution and an exposure device to which the pulse width modulating device is applied.

2. Description of the Related Art

FIG. 16 illustrates a general structural example of a conventional pulse width modulating device which generates pulse width modulating signals (hereinafter, "PWM signals").

In a pulse width modulating device 80 illustrated in FIG. 16, in accordance with a reset signal generated by a clock generator 82, a set signal is inputted to a set terminal (S terminal) of an R-S flip-flop 86 by a control logic 84, and the output signal from an output terminal (Q terminal) of the R-S flip-flop 86 rises. The reset signal generated by the clock generator 82 is inputted to a counter 88 so that the counter 88 is reset.

Thereafter, counting by the counter 88 of an operation clock generated by an operation clock generator 90 begins. A comparator 92 compares this counted value with PWM data which expresses the pulse width of each pulse of a PWM signal which is to be generated. When the counted value and the PWM data are equal, with a signal outputted from the comparator 92 as a trigger, the control logic 84 outputs a pulse to a reset terminal (R terminal) of the R-S flip-flop 86. The output signal of the R-S flip-flop 86 thereby falls, and the PWM signal which is to be generated is obtained.

However, in the above-described conventional pulse width modulating device, as described above, the pulses of the operation clock are counted, and the timing of the fall of the PWM signal is determined on the basis of the results of comparison of the counted value and the PWM data. Therefore, the bit resolution of the generated PWM signal (the number of bits of PWM data which can be reproduced by the maximum pulse width of the PWM signal) is determined by the frequency of the operation clock, and a drawback arises in that the determined bit resolution cannot be improved.

Namely, in a case in which, for example, the frequency of the operation clock is 40 MHz and the maximum pulse width of the PWM signal is 102.375 µS, at a unit of 25 nS (=1/40 MHz), a resolution of only 4095 (=102.375 µS÷25 nS, 12 bits) can be obtained for the pulse width.

Accordingly, when such a pulse width modulating device is applied to an exposure device which carries out exposure in accordance with the pulse width of a PWM signal, a problem arises in that the accuracy of the exposure time cannot be improved above the accuracy determined in accordance with the frequency of the operation clock.

SUMMARY OF THE INVENTION

The present invention was developed in order to overcome the aforementioned drawbacks, and an object of the present invention is to provide a pulse width modulating device which can improve the bit resolution of a pulse width modulating signal to be generated, and to provide an exposure device which can improve the accuracy of exposure time.

In order to achieve the above object, the present invention provides a pulse width modulating device comprising: a clock generating device which generates a first clock signal; an operation device which operates the first clock signal and generates at least one processing clock signal whose phase is different than a phase of the first clock signal; and a pulse width modulating signal output device which makes a pulse of a pulse width modulating signal rise synchronously with one of the first clock signal and the processing clock signal generated by said operation device, and makes the pulse of the pulse width modulating signal fall synchronously with a remaining one of the first clock signal and the processing clock signal generated by said operation device.

The pulse width modulating device of the first aspect of the present invention includes: a clock generating device which generates a clock signal which is a reference for timing for generating respective pulses of a pulse width modulating signal; a delay device which delays the clock signal by a predetermined period of time; and a pulse width modulating signal output device which makes the respective pulses of the pulse width modulating signal rise synchronously with one of the clock signal and the clock signal delayed by the delay device, and makes the respective pulses of the pulse width modulating signal fall synchronously with the other of the clock signal and the clock signal delayed by the delay device.

In accordance with the pulse width modulating device of the first aspect, a clock signal, which is a reference for the timing for generating respective pulses of the pulse width modulating signal, is generated by the clock generating device. The clock signal is delayed for a predetermined time by the delay device. Here, the delay time of the clock signal caused by the delay device is usually a time which is less than one period of the clock signal. However, the delay time of the clock signal may be any time provided that it is a time other than an integer multiple of one period of the clock signal. A digital delay circuit, a delay line or the like may be used as the delay device.

Thereafter, due to the pulse width modulating signal outputting device, the pulses of the pulse width modulating signal are made to rise synchronously with one of the clock signal and the clock signal which has been delayed by the delay device, and the pulses of the pulse width modulating signal are made to fall synchronously with the other of the clock signal and the clock signal delayed by the delay device.

In this way, in accordance with the pulse width modulating device of the first aspect, the pulses of the pulse width modulating signal are made to rise synchronously with one of the clock signal and the clock signal which has been delayed by the delay device, and the pulses of the pulse width modulating signal are made to fall synchronously with the other of the clock signal and the clock signal delayed by the delay device. Therefore, the bit resolution of the pulse width modulating signal can be improved over a case in which the rising and falling of pulses is effected on the basis of the clock signal alone.

A pulse width modulating device of a second aspect of the present invention includes: a clock generating device which generates a clock signal which is a reference for timing for generating respective pulses of a pulse width modulating signal; a plurality of delay devices which each delay the clock signal; and a pulse width modulating signal output device which makes the respective pulses of the pulse width modulating signal rise synchronously with one of the clock signal and a plurality of clock signals delayed by the plurality of delay devices, and makes respective pulses of the pulse width modulating signal fall synchronously with a remaining one of the clock signal and the plurality of clock signals delayed by the plurality of delay devices.

In accordance with the pulse width modulating device of the second aspect, a clock signal, which is a reference for the timing for generating respective pulses of the pulse width generating signal, is generated by a clock generating device. The clock signal is delayed by respective delay devices. Here, the delay times of the clock signal caused by the plurality of delay devices may all be the same delay time, or may be respectively different delay times. Further, the plurality of delay devices may be connected in series, or may be connected in parallel. A digital delay circuit, a delay line or the like may be used as the delay device.

Thereafter, due to the pulse width modulating signal outputting device, the pulses of the pulse width modulating signal are made to rise synchronously with one of the clock signal and the plurality of clock signals which are delayed by the respective delay devices, and the pulses of the pulse width modulating signal are made to fall synchronously with a remaining one of the clock signal and the plurality of clock signals.

In this way, in accordance with the pulse width modulating device of the second aspect, the pulses of the pulse width modulating signal are made to rise synchronously with one of the clock signal and the plurality of clock signals which are delayed by the respective delay devices, and the pulses of the pulse width modulating signal are made to fall synchronously with a remaining one of the clock signal and the plurality of clock signals. Thus, the bit resolution of the pulse width modulating signal can be improved as compared to a case in which a single delayed clock signal is generated by a single delay device.

A pulse width modulating device of a third aspect of the present invention includes: a clock generating device which generates a clock signal which is a reference for timing for generating respective pulses of a pulse width modulating signal; an inverting device for inverting the clock signal; and a pulse width modulating signal output device which makes the respective pulses of the pulse width modulating signal rise synchronously with one of the clock signal and the clock signal inverted by the inverting device, and makes the respective pulses of the pulse width modulating signal fall synchronously with a remaining one of the clock signal and the clock signal inverted by the inverting device.

In accordance with the pulse width modulating device of the third aspect, a clock signal, which is a reference for the timing for generating the respective pulses of the pulse width modulating signal, is generated by the clock generating device, and the clock signal is inverted by the inverting device.

Thereafter, by the pulse width modulating signal outputting device, the pulses of the pulse width modulating signal are made to rise synchronously with one of the clock signal and the clock signal which has been inverted by the inverting device, and the pulses of the pulse width modulating signal are made to fall synchronously with the other of the clock signal and the clock signal inverted by the inverting device.

Thus, in accordance with the pulse width modulating device of the third aspect, because the pulses of the pulse width modulating signal are made to rise synchronously with one of the clock signal and the clock signal which has been inverted by the inverting device, and the pulses of the pulse width modulating signal are made to fall synchronously with the other of the clock signal and the clock signal inverted by the inverting device, the bit resolution of the pulse width modulating signal can be improved as compared with a case in which rising and falling of the pulses is carried out only on the basis of a clock signal.

An exposure device of a fourth aspect of the present invention includes the pulse width modulating device of any of the first through the third aspects; and a light source for exposure which emits light in accordance with the pulse width of respective pulses of the pulse width modulating signal outputted by the pulse width modulating signal output device provided at the pulse width modulating device.

In accordance with the fourth aspect, the light source for exposure emits light in accordance with the pulse width of respective pulses of the pulse width modulating signal outputted by the pulse width modulating signal output device provided at the pulse width modulating device of any of the first through the third aspects. The light source may be any light emitting element, such as a light-emitting diode, a laser diode, or the like.

In this way, the exposure device of the fourth aspect is provided with the pulse width modulating device of the present invention which enables an improvement in the bit resolution of the pulse width modulating signal. The light source for exposure emits light in accordance with the pulse width of the respective pulses of the pulse width modulating signal outputted by the pulse width modulating signal output device provided at the pulse width modulating device. Thus, the exposure time of the light source can be made more accurate.

Another aspect of the present invention is a pulse width modulating method comprising the steps of: (a) generating a first clock signal; (b) operating the first clock signal and generating at least one clock signal whose phase is different than a phase of the first clock signal; and (c) making a pulse of a pulse width modulating signal rise synchronously with one of the first clock signal and the clock signal generated in step (b), and making the pulse of the pulse width modulating signal fall synchronously with a remaining one of the first clock signal and the clock signal generated in step (b).

Yet another aspect of the present invention is an exposure method comprising the steps of: (a) generating a first clock signal; (b) operating the first clock signal and generating at least one clock signal whose phase is different than a phase of the first clock signal; (c) making a pulse of a pulse width modulating signal rise synchronously with one of the first clock signal and the clock signal generated in step (b), and making the pulse of the pulse width modulating signal fall synchronously with a remaining one of the first clock signal and the clock signal generated in step (b); and (d) emitting light so as to effect exposure in accordance with a pulse width of respective pulses of the pulse width modulating signal.

DESCRIPTION OF THE PREFERRED EMBODIMENTS

In the present embodiments, description will be given of a case in which a pulse width modulating device relating to the present invention is applied to a section which controls light emission of LED chips in an image recording device in which an image is recorded on a photosensitive material by controlling the emission of light of the LED chips on the basis of image data.

First Embodiment

Overall Structure

Figure 1:
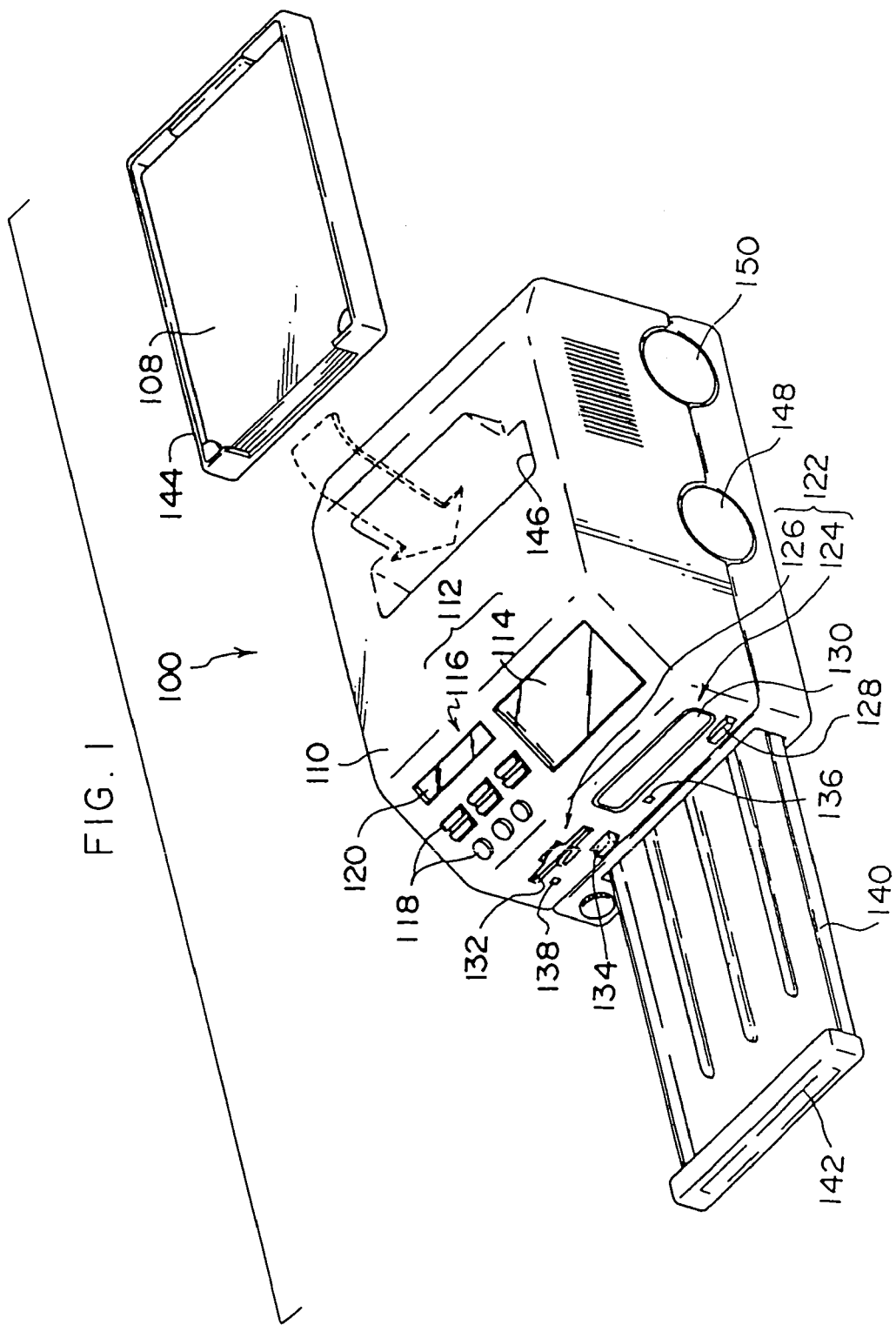
FIG. 1 is a perspective view illustrating an image recording device relating to embodiments of the present invention.

An image recording device 100 relating to the present embodiments will be described hereinafter with reference to FIGS. 1 through 3.

The image recording device 100 reads image data recorded on a CD-ROM 102 or an FD (floppy disk) 104 (see FIG. 3), exposes an image based on the image data onto a photosensitive material 106, and transfers the image recorded on the photosensitive material 106 onto regular paper (an image receiving paper 108).

The upper portion of the front surface (the left side surface in FIG. 3) of a box-like casing 110 is an inclined surface, and an operation display section 112 is provided thereat.

Figure 2:
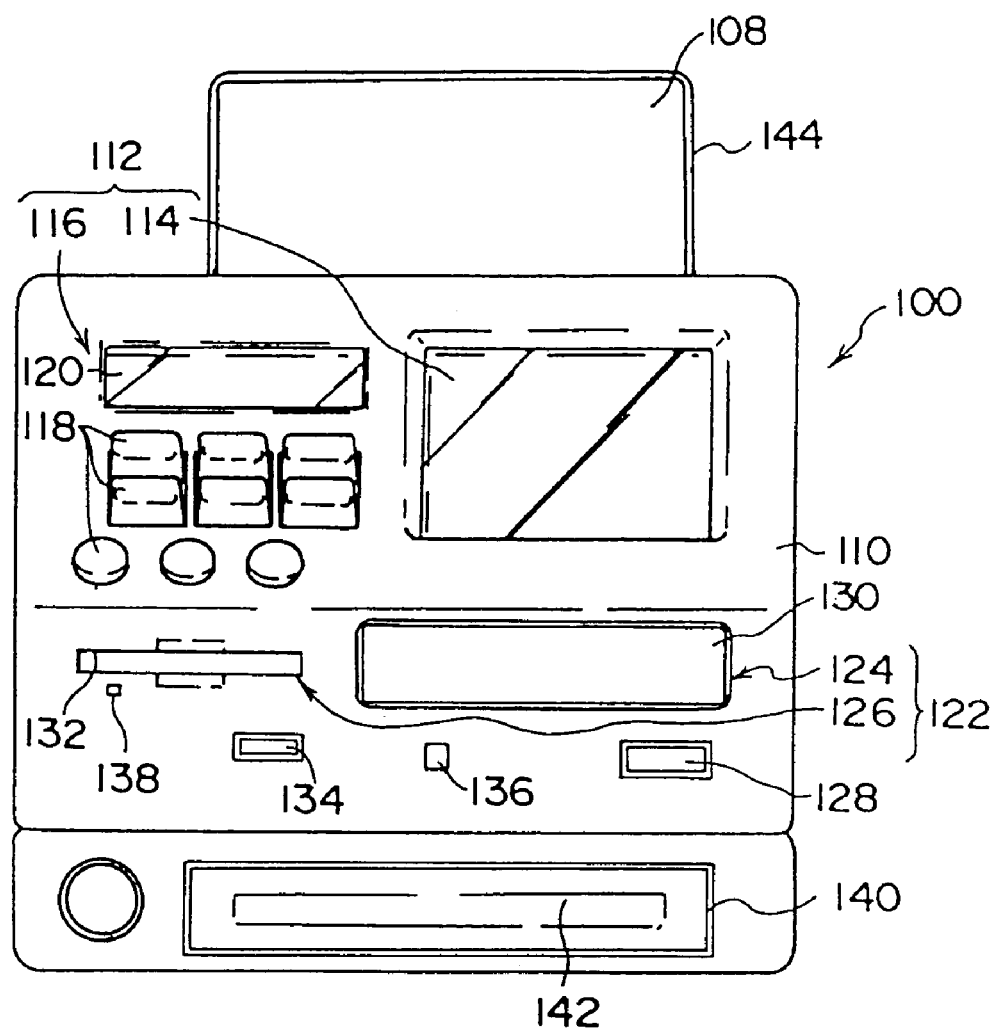
FIG. 2 is a front view of the image recording device relating to the embodiments of the present invention.

As illustrated in FIG. 2, the operation display section 112 is divided into a monitor section 114 positioned at the right and an input section 116 positioned at the left. The monitor section 114 displays the read image.

The input section 116 includes plural operation keys 118 and a display portion 120 for confirming inputted data. Data necessary for image recording, such as the number of images to be recorded, size setting, color balance adjustment, negative/positive selection, and the like, can be inputted through the input section 116.

A deck section 122 is disposed beneath the operation display section 112, and includes a CD-ROM deck portion 124 which is positioned at the right side in FIG. 2, and an FD deck portion 126 positioned at the left side.

At the CD-ROM deck portion 124, a tray 130 can be opened and closed by pushing an open/close button 128. A CD-ROM 102 can be loaded into the device by being placed on the tray 130.

The FD deck portion 126 includes an FD insertion throttle 132. By inserting an FD 104, a driving system within the device is operated, and the FD 104 is pulled in. When the FD 104 is to be removed, an operation button 134 is pressed so that the FD 104 can be removed.

An access lamp 136 is provided at the CD-ROM deck portion 124, and an access lamp 138 is provided at the FD deck portion 126. The access lamp 136 or 138 is lit when the CD-ROM 102 or the FD 104, respectively, is being accessed within the device.

A discharge tray 140 is disposed beneath the deck section 122. The discharge tray 140 is usually accommodated within the device, and can be pulled out by an operator grasping a handle portion 142 (see FIG. 1).

The image receiving paper 108 on which an image has been recorded is discharged onto the discharge tray 140.

The image receiving papers 108 are accommodated in advance in a stack on a tray 144 which is loaded into a tray loading opening 146 provided at the top surface of the casing 110. The image receiving papers 108 are removed one-by-one from the tray 144 loaded in the tray loading opening 146. After an image is transferred thereon, the image receiving paper 108 is guided to the discharge tray 140.

Two circular cover members 148, 150 are removably attached to the right side surface (the surface toward the front of the drawing of FIG. 1) of the casing 110. As illustrated in FIG. 3, a supply reel 152, around which the rolled photosensitive material 106 is wound, and a take-up reel 154 are disposed at the interior of the device along the axial directions of the cover members 150, 148, respectively. With the cover members 150, 148 removed, the reels 152, 154 can be placed into and removed from the device.

Image Receiving Paper Conveying System

Figure 3:
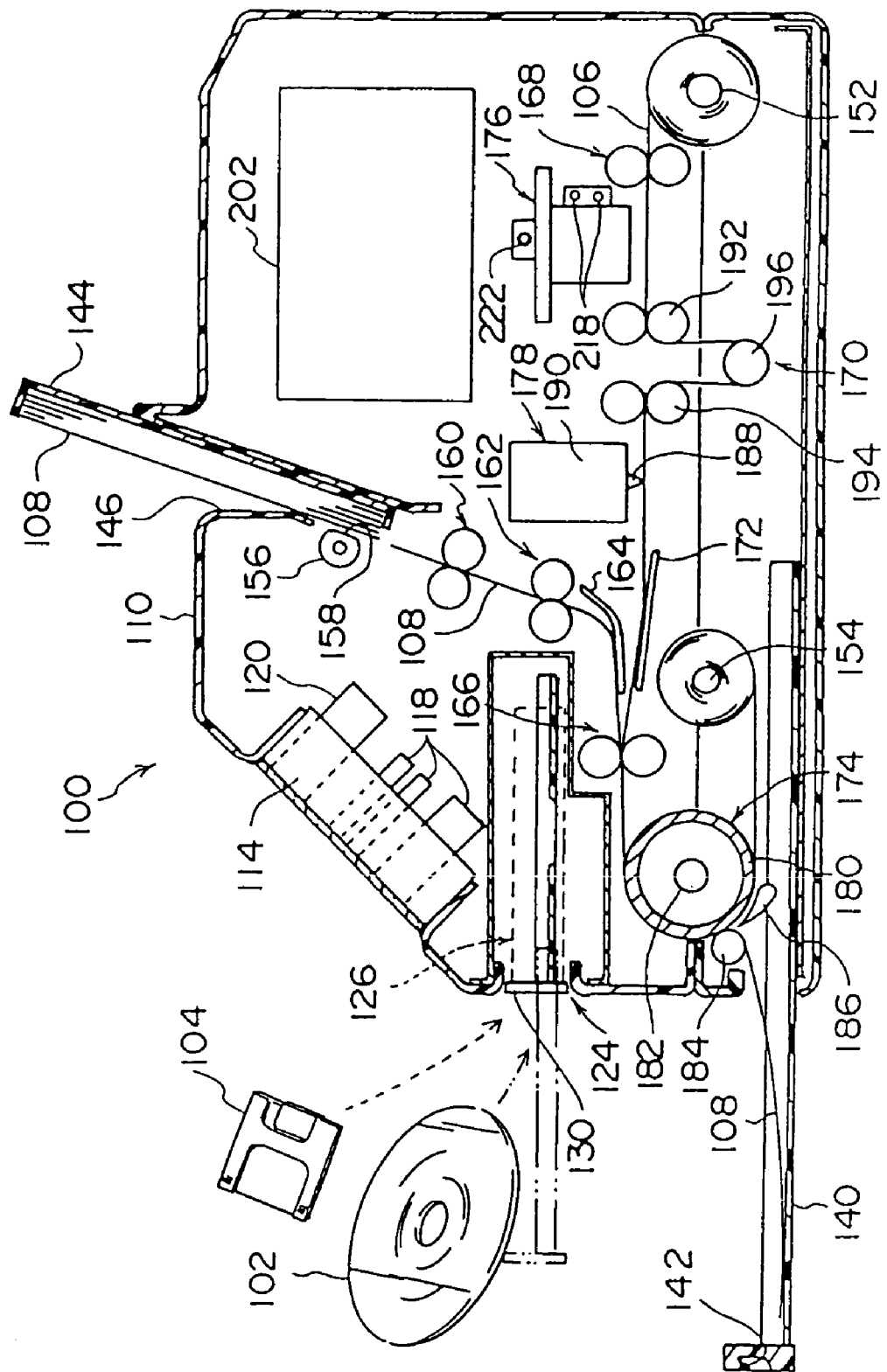
FIG. 3 is a side sectional view illustrating the internal structure of the image recording device relating to the embodiments of the present invention.

As illustrated in FIG. 3, the top surface of the leading end portion of the tray 144 loaded in the tray loading opening 146 opposes a semicircular roller 156.

A portion of the peripheral surface of the semicircular roller 156 cut at a surface parallel to the axis thereof. Usually, a cut portion 158 of the semicircular roller 156 opposes the uppermost image receiving paper 108 in the tray 144, with a predetermined distance therebetween. Here, when the semicircular roller 156 rotates, the peripheral surface of the semicircular roller 156 contacts the uppermost image receiving paper 108, and the image receiving paper 108 is pulled out a slight amount by one rotation of the semicircular roller 156. The pulled-out image receiving paper 108 is nipped by a first roller pair 160, and is completely pulled out from the tray 144 due to the driving force of the first roller pair 160.

A second roller pair 162, a guide plate 164, and a third roller pair 166 are disposed in that order at the downstream side of the first roller pair 160. After the image receiving paper 108 has been nipped by the first roller pair 160, the image receiving paper 108 is nipped by the second roller pair 162, guided by the guide plate 164, and nipped by the third roller pair 166.

At the third roller pair 166, the image receiving paper 108 is superposed together with the photosensitive material 106. Namely, the third roller pair 166 is also used as the conveying path of the photosensitive material 106.

Photosensitive Material Conveying System

The photosensitive material 106 is loaded in the device as an elongated form wound in layers around the supply reel 152. The supply reel 152 can be loaded at a predetermined position by removing the cover member 150 (at the rear of the device) and inserting the supply reel 152 in the axial direction.

With the photosensitive material 106 loaded at a predetermined position, the uppermost layer thereof is pulled out. As the initial setting, the photosensitive material 106 is loaded along a predetermined conveying path. The processes of this loading are as follows. The outermost layer of the photosensitive material 106 is pulled out from the supply reel 152, is nipped by a fourth roller pair 168 in a vicinity of the position at which the supply reel 152 is disposed, passes through a reverser section 170 and by a guide plate 172, is nipped by the third roller pair 166, and thereafter, is trained about a heat roller 174 and taken up onto the take-up reel 154. Here, a leader tape of a length needed for loading may be provided at the leading end portion of the photosensitive material 106 wound on the supply reel 152.

An exposure section 176 is provided on the conveying path of the photosensitive material 106 between the fourth roller pair 168 and the reverser section 170. A water application section 178 is provided between the reverser section 170 and the guide plate 172. Although details of the exposure section 176 and the water application section 178 will be described later, to basically summarize the processes involved thereat, after an image is exposed onto the photosensitive material 106 at the exposure section 176, water is applied onto the emulsion surface (exposure surface) thereof, and in this state, the photosensitive material 106 is superposed with the image receiving paper 108 at the third roller pair 166.

Heat Roller

The heat roller 174 is the heat development transfer section of the present device, and includes a cylindrical roller main body 180 and a heater 182 which is provided within the roller main body 180 along the axial direction thereof. By operating the heater 182, the surface of the roller main body 180 is heated. The heat roller 174 thereby serves to apply heat to the members (the photosensitive material 106 and the image receiving paper 108) trained about the roller main body 180. Heat development transfer processing is carried out due to this heating, such that the image recorded on the photosensitive material 106 is transferred onto the image receiving paper 108.

A peeling roller 184 and a peeling claw 186 are provided in a vicinity of the heat roller 174 at the lower left thereof. The peeling roller 184 and the peeling claw 186 peel the image receiving paper 108, which is trained around about ⅓ of the circumference of the heat roller 174, off from the photosensitive material 106, and guide the image receiving paper 108 toward the discharge tray 140.

The photosensitive material 106 is trained around approximately ½ of the circumference of the heat roller 174, is rotated by 180°, and is guided toward the position at which the take-up reel 154 is disposed.

Water Application Section

As illustrated in FIG. 3, the water application section 178 applies water, which serves as an image forming solvent, to the photosensitive material 106 or the image receiving paper 108, and makes the superposed surfaces thereof contact each other closely, and effects heat development. The water application section 178 includes an application portion 188 which is elongated along the widthwise direction of the photosensitive material 106, and a tank 190 in which water is stored.

The application portion 188 is a highly-absorbent member such as felt, sponge or the like, has an appropriate hardness, and contacts the photosensitive material 106 at a predetermined pressure while the photosensitive material 106 is being conveyed. Due to capillary action, an appropriate amount of the water in the tank 190 constantly moves toward the application portion 188. Due to the application portion 188 contacting the photosensitive material 106, water is applied to the surface (emulsion surface) of the photosensitive material 106 by the application portion 188.

Because the application portion 188 abuts the photosensitive material 106 at an appropriate pressure, the water is applied uniformly to the photosensitive material 106.

Water can be replenished to the tank 190 by removing the entire water application section 178. Or, pipes may be provided so that water is always supplied from the exterior of the device.

In the present first embodiment, water is used as the image forming solvent. However, this water does not necessarily have to be pure water, and includes water in the broad, generally-used sense thereof. Further, a mixed solvent of water and a low temperature boiling point solvent such as methanol, DMF, acetone, diisobutyl ketone or the like may be used. Moreover, the solvent may be a solution containing image forming accelerators, fog-preventing agents, development stopping agents, hydrophilic heat solvents, or the like.

Exposure Section

Figure 4:
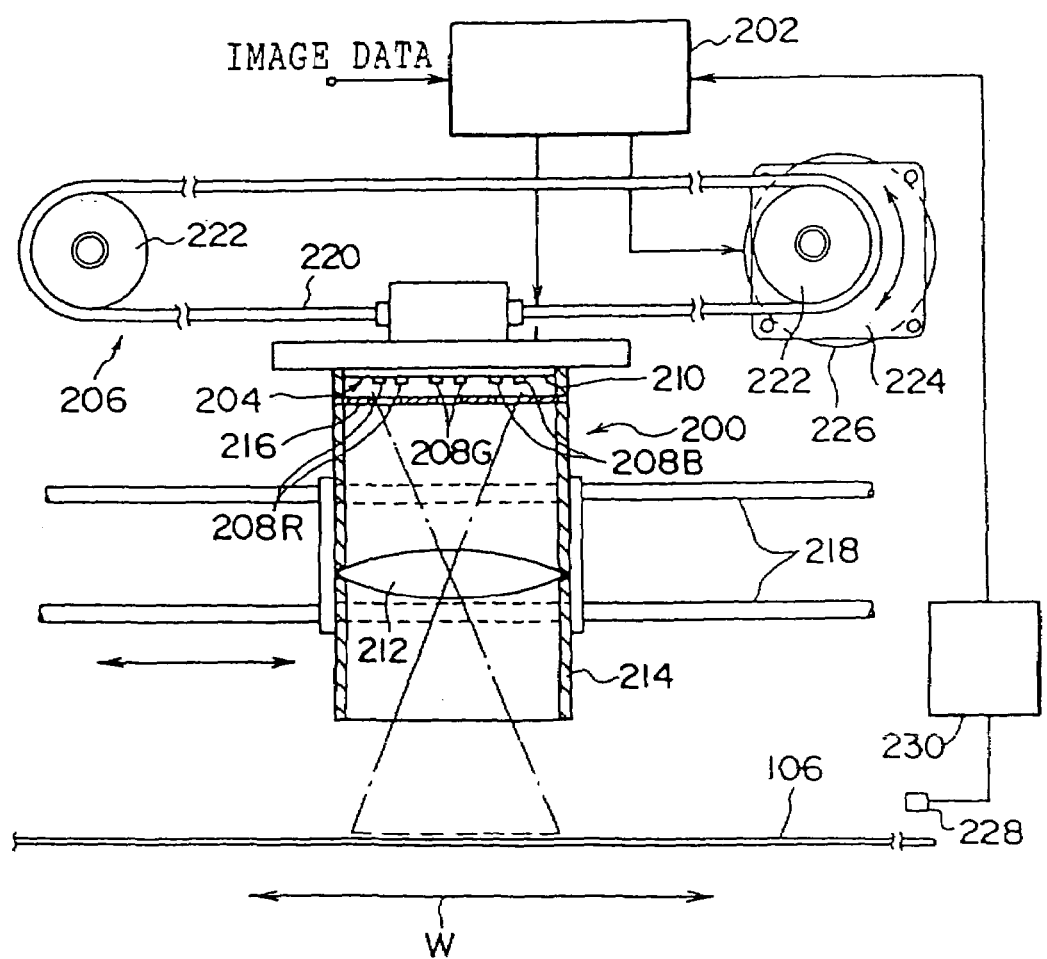
FIG. 4 is a front view illustrating a schematic structure of an exposure section.

The exposure section 176 relating to the present first embodiment is illustrated in FIG. 4.

The main structure of the exposure section 176 is a light source unit 200 disposed above the conveying path of the photosensitive material 106. The exposure section 176 is connected to a controller 202. Image data (image data read from the CD-ROM 102 or the FD 104) is inputted to the controller 202. In accordance with this image data, the controller 202 lights a light source portion 204 for full color image formation which is within the light source unit 200. The structure of the portion within the controller 202 that lights the light source portion 204 for full color image formation and that particularly relates to the present invention, as well as the peripheral structure of this portion, i.e., the portion corresponding to the pulse width modulating device of the present invention, will be described in detail later.

The light source unit 200 is movable along the widthwise direction (main scanning direction) of the photosensitive material 106 due to the driving of a main scanning unit 206 which will be described later. The photosensitive material 106 is subjected to main scanning at times when the exposure section 176 is stopped while being step-moved.

Figure 5:
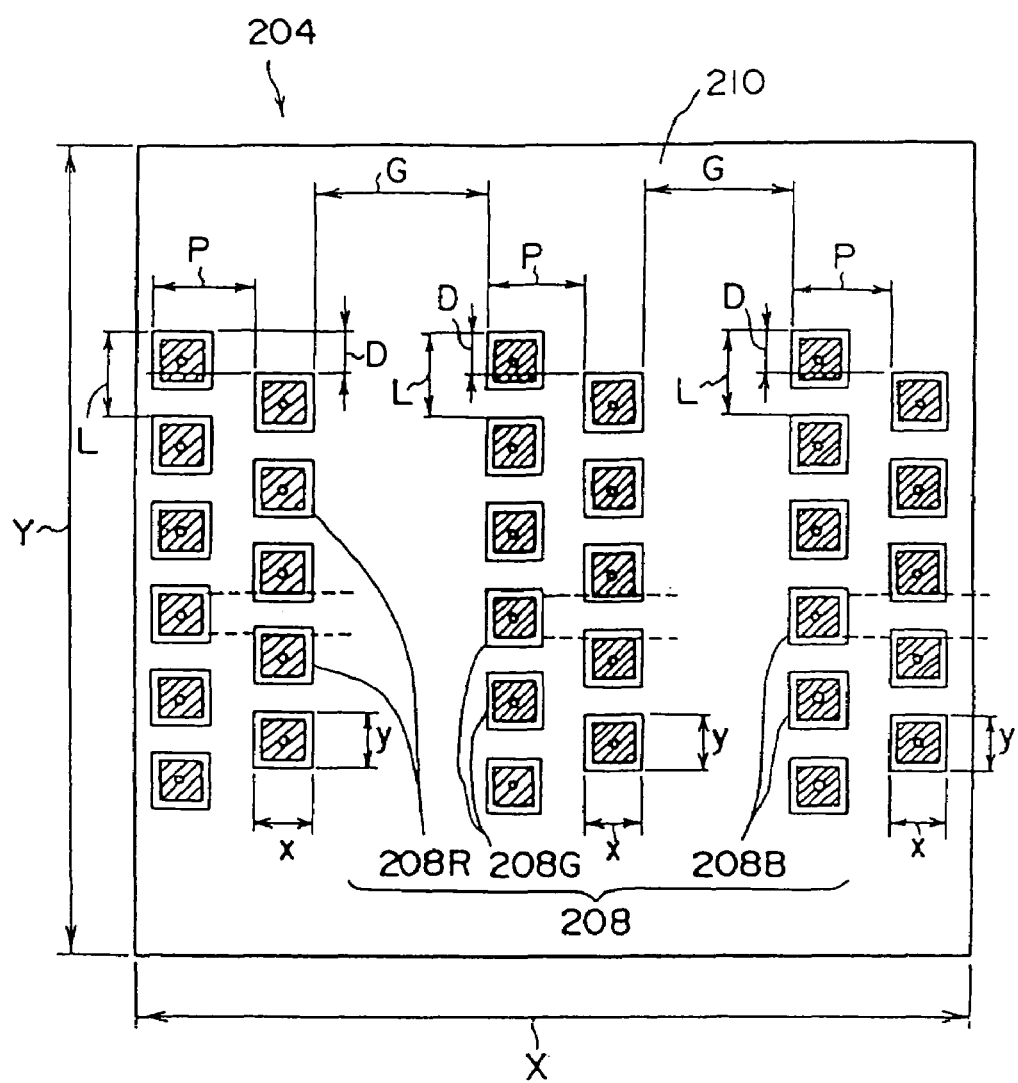
FIG. 5 is a plan view summarily illustrating an arrangement of LED chips in a light source section.

The light source unit 200 of the exposure section 176 is covered a box-shaped exposure casing 214. The light source portion 204 for full color image formation is disposed at the top end surface of the exposure casing 214, such that the light-emitting surface of the light source portion 204 for full color image formation opposes an opening in the exposure casing 214. An aperture 216, at which a rectangular opening is provided for each of the light-emitted colors, is formed at the light-emitting surface side of the light source portion 204 for full color image formation. The aperture 216 limits the spreading of the lights emitted from R-LED chips 208R, G-LED chips 208G, and B-LED chips 208B which emit light of R (red), G (green) and B (blue), respectively. (Here, as illustrated in FIG. 5, eleven R-LED chips 208R, eleven G-LED chips 208G, and eleven B-LED chips 208B are provided.)

A lens 212 is provided at the central portion of the exposure casing 214 at the downstream side of the aperture 216. The lens 212 collects the light from the light source portion 204 for full color image formation, and focuses the light in a vicinity of the photosensitive material 106. The resolution of the focused light is about 300 to 400 dpi. Although the lens 212 is illustrated as a single body in the figures, the lens 212 may be formed by a single lens system combining a plurality of lenses.

If the lens 212 is formed by a plurality of lenses and a diaphragm and has the characteristic that the magnification does not change even if the height of the image surface changes to a certain extent, slight errors at the time of main-scanning movement of the main scanning unit 206 can be absorbed.

The focus is always adjusted by an autofocus mechanism (not illustrated).

The light source unit 200 is supported by a pair of parallel guide shafts 218 which form a portion of the main scanning unit 206. The guide shafts 218 are disposed along the transverse direction of the photosensitive material 106 (the direction of arrow W in FIG. 4). The light source portion 204 for full color image formation is guided by the guide shafts 218, and is movable along the transverse direction of the photosensitive material 106.

One portion of an endless timing belt 220 is fixed to the exposure casing 214 of the light source portion 204 for full color image formation. Ends of the timing belt 220 are trained around sprockets 222 positioned in the vicinities of ends of the guide shafts 218. The rotating shaft of one of the sprockets 222 is connected to the rotating shaft of a stepping motor 226 via a speed change gear 224. Due to the reciprocating rotation of the stepping motor 226, the light source portion 204 for fill color image formation is moved reciprocatingly along the guide shafts 218.

The driving of the stepping motor 226 is controlled by the controller 202, and is synchronized with the step-movement of the photosensitive material 106. Namely, in the state in which the photosensitive material 106 is moved one step and stopped, the stepping motor 226 begins to rotate so that the light source portion 204 for full color image formation moves along the transverse direction of the photosensitive material 106 above the photosensitive material 106. After a predetermined number of pulses has been confirmed, by driving the stepping motor 226 reversely, the light source portion 204 for full color image formation is returned to its original position. The next movement of the photosensitive material 106 is started synchronously with the return movement of the light source portion 204 for full color image formation.

A photodiode 228 is disposed at the light outputting side of the light source unit 200 in a vicinity of a surface which opposes the photosensitive material 106 and in a vicinity of the start of main scan position. The photodiode 228 outputs an analog signal of a magnitude which is proportional to the amount of light of the light source from the light source portion 204 for full color image formation. The photodiode 228 is connected to a light amount correction unit 230, and the analog signal is inputted to the light amount correction unit 230.

At the light amount correction unit 230, detected amounts of the lights from the LED chips 208 of the respective colors are compared, the light amounts and color balance are adjusted, and a correction value is outputted to the controller 202. On the basis of this correction value, the image data sent to the light source portion 204 for full color image formation is corrected so that the respective LED chips 208 are lit at the appropriate light amounts.

As illustrated in FIG. 5, the B-LED chips 208B, the G-LED chips 208G, and the R-LED chips 208R are formed collectively at the light source portion 204 for full color image formation. These LED chips 208B, 208G, 208R are mounted on a substrate 210 along the transverse direction (main scanning direction) of the photosensitive material 106 in the same pattern of arrangement. Namely, at the right end of the substrate 210 as seen in plan view, the eleven B-LED chips 208B are arranged in two staggered lines. At the left end of the substrate 210, the eleven R-LED chips 208R are arranged in two staggered lines. At the center of the substrate 210, the eleven G-LED chips 208G are arranged in two staggered lines. Thus, a total of six lines of LED chips are provided on the substrate 210.

Predetermined wires are formed on the substrate 210 by etching processing or the like. The substrate 210 is covered by metal so that the wires do not short-circuit. The substrate 210 also has a heat-dissipating function. As a result, the generation of heat by the LED chips 208 being lit can be suppressed, and fluctuations in the amount of emitted light can be suppressed. Note that the external dimensions (x×y) of each LED chip 208 are about 360 $\mu$m×360 $\mu$m.

As shown in FIG. 5, it is preferable that the pitch P between rows of the same color LED chips 208 mounted to the substrate 210 (i.e., the pitch in the main scanning direction) is 600 $\mu$m, and that the line pitch L (the pitch in the subscanning direction) is 520 $\mu$m. When the LED chips 208 are arranged in a staggered configuration, it is preferable that the dimension D of the stagger is 260 $\mu$m. The interval dimension G between the respective colors is preferably the same for the interval between R and G and the interval between G and B. The hatched portions of the LED chips 208 illustrated in FIG. 5 are the regions which actually emit light. The borders of the light emitting regions of the staggered LEDs in adjacent rows of the same color correspond to each other.

With the light source portion 204 for full color image formation structured as described above, eleven main scan lines for each color can be recorded on the photosensitive material 106 by one main scan. The main scan line pitch is 10, which is an even number.

Figure 6:
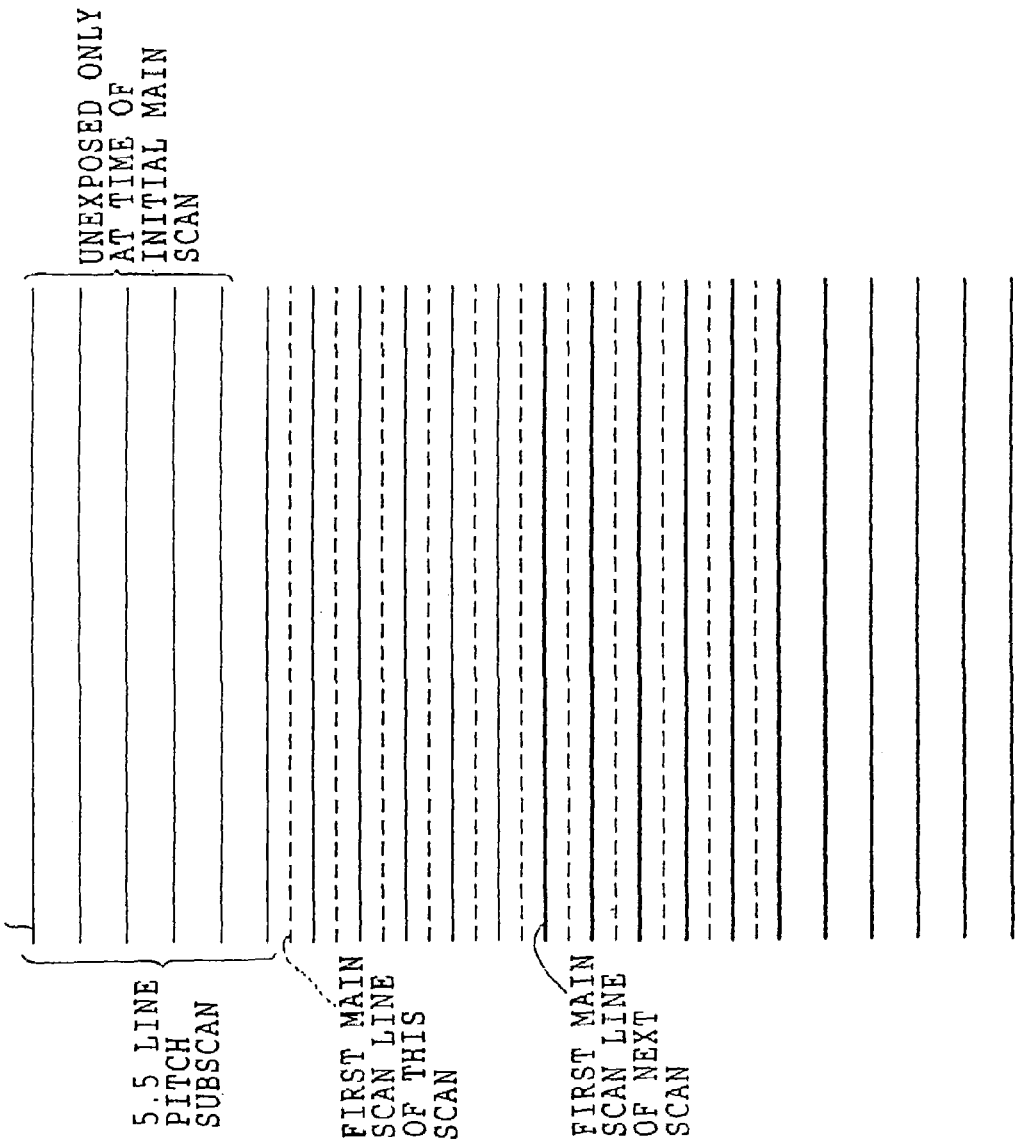
FIG. 6 is a plan view of a photosensitive material showing main scanning lines and a subscanning pitch.

In the present embodiment, as illustrated in FIG. 6, the step movement of the photosensitive material 106 is controlled such that subscanning direction driving and stopping are repeated such that the first main scan line recorded on the photosensitive material 106 this time (i.e., during this scan) is at a pitch (5.5 line pitch) which falls at an intermediate position between the sixth and seventh main scan lines of the previous scan. In FIG. 6, the thin solid lines are the eleven main scan lines formed by main scanning the previous time, the chain lines are the eleven main scan lines formed by main scanning this time, and the thick solid lines are eleven scan lines which will be formed by main scanning the next time.

In this way, by using an odd number of LED chips 208, the number of intervals between main scan lines is even (i.e., 10 intervals), and the resolution can be doubled by forming further main scan lines between the main scan lines. There are an odd number of LED chips 208 for each light-emitting color, there are an even number of intervals between the LED chips 208, and scanning lines are formed between the main scan lines. Thus, the subscanning pitches can all be made the same. Further the first through the fifth main scan lines of the initial main scanning driving are not written under control.

Figure 7:
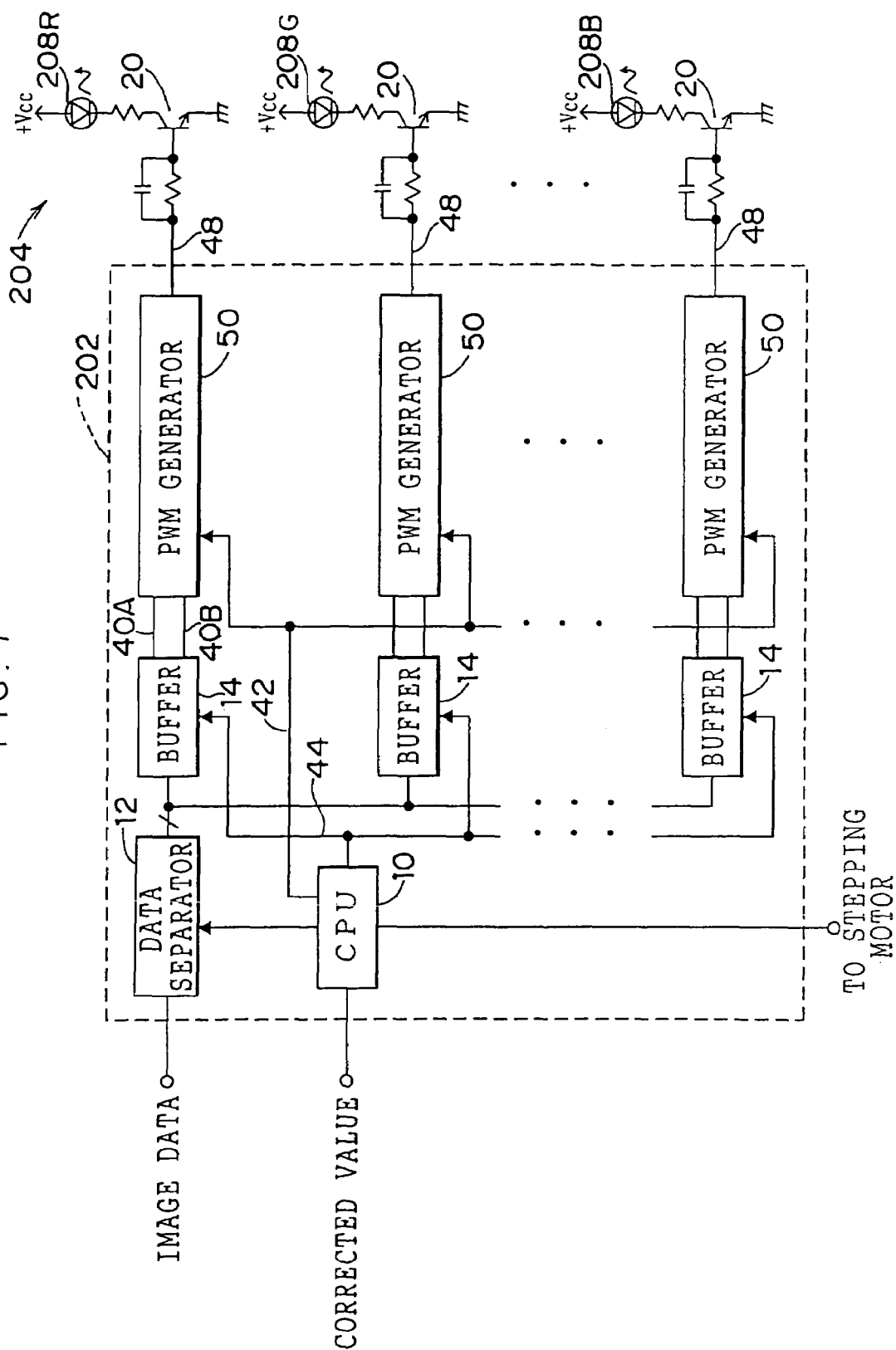
FIG. 7 is a block diagram illustrating the structure of a section, within a controller, which lights the light source section, in accordance with the embodiments of the present invention.

Next, with reference to FIG. 7, explanation will be given of the portion within the controller 202 that lights the light source portion 204 for full color image formation and the peripheral structures thereof, which particularly relate to the present invention. Namely, description will be given of the structure of the portion of the controller 202 which includes the portion corresponding to the pulse width modulating device of the present invention.

The controller 202 includes a CPU 10 which governs operation of the controller 202, a data separator 12 which divides the image data inputted serially in correspondence with the eleven R-LED chips 208R, G-LED chips 208G and B-LED chips 208B into image data of the respective LED chips, and outputs the divisional data, and buffers 14 and PWM generators 50 of the same number as the number of LED chips (33 in the present embodiment).

The output terminal of the data separator 12 is connected to the input terminal of each buffer 14, and the output terminal of each buffer 14 is connected to the input terminal of the PWM generator corresponding 50 thereto. The output terminal of each PWM generator 50 is connected to the base terminal of a corresponding transistor 20 in series via a parallel circuit formed by a capacitor and a resistor. The number of transistors 20 provided is the same as the number of LED chips.

The collector terminal of each transistor 20 is connected, via a resistor, to the cathode terminal of one of the R-LED chips 208R, G-LED chips 208G or B-LED chips 208B. A predetermined power source voltage Vcc is applied to the anode terminal of each LED chip. Further, the emitter terminal of each transistor 20 is grounded.

The CPU 10 is connected to the previously-mentioned light amount correction unit 230 and the data separator 12. The CPU 10 corrects the image data inputted to the data separator 12 on the basis of the correction value inputted from the light amount correction unit 230, and the CPU 10 adds delay selection data 40B (see FIG. 8), which will be described later, to image data 40A which is data which has been divided by the data separator 12 and corresponds to one of the LED chips. Accordingly, the data outputted to the buffer 14 from the data separator 12 (hereinafter, this data will be referred to as "PWM data") is formed by the image data 40A and the delay selection data 40B.

The CPU 10 is also connected to each buffer 14, each PWM generator 50, and to the stepping motor 226. The CPU 10 controls the timing of the output the PWM data stored in each buffer 14, outputs to each PWM generator 50 a pixel clock 42 expressing one period at the time that one pixel of the image is recorded in the main scanning direction, and controls the step-movement of the light source portion 204 for full color image formation.

Figure 8:
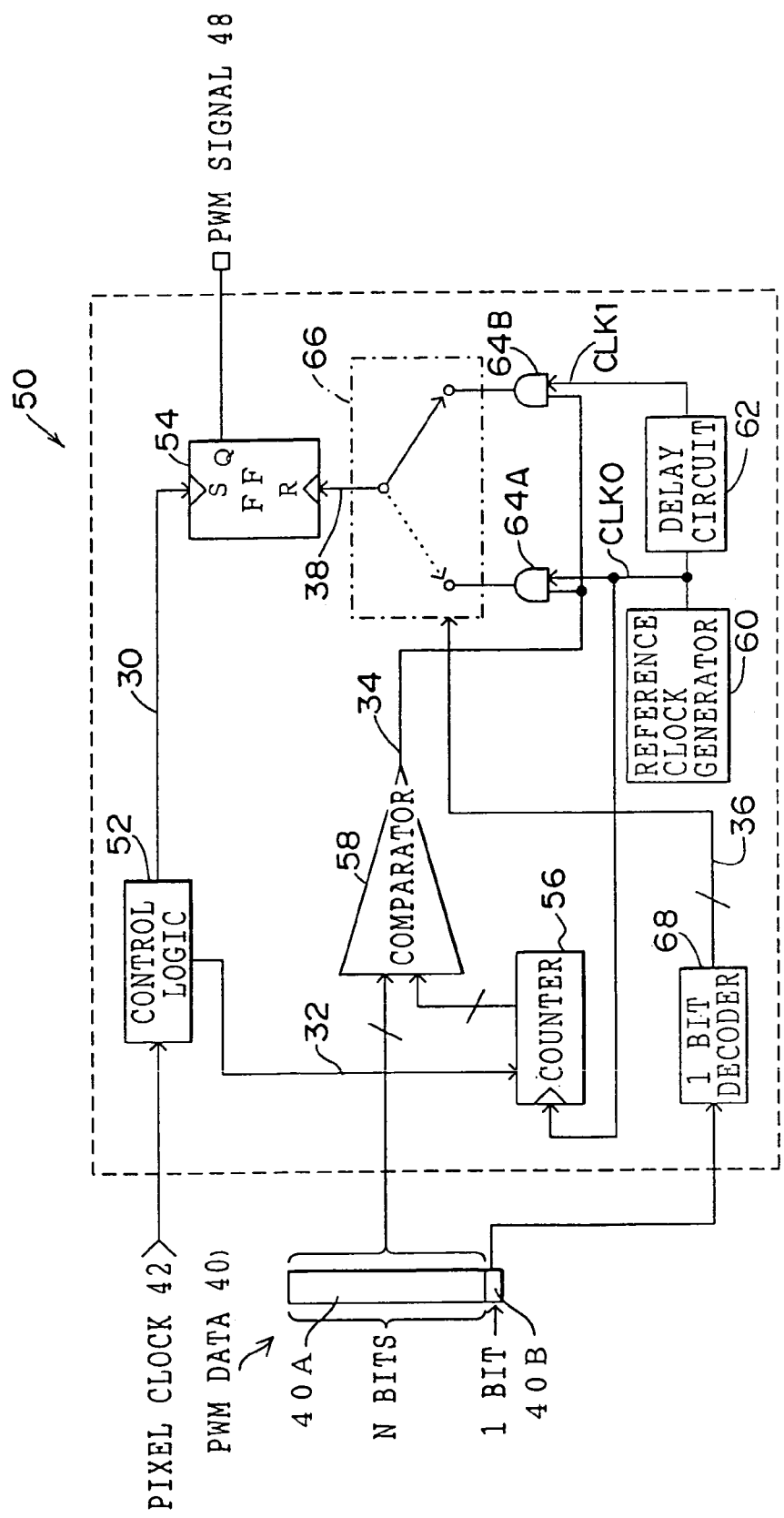
FIG. 8 is a block diagram illustrating the structure of a PWM generator relating to a first embodiment.

Next, with reference to FIG. 8, the structure of the PWM generators 50, which are provided in the same number as the number of LED chips, will be described. As shown in FIG. 8, the PWM generator 50 includes a control logic 52 whose input terminal is connected to the CPU 10 and to which the pixel clock 42 is inputted. One of the output terminals of the control logic 52 is connected to a set terminal (S terminal) of a R-S flip-flop 54, and the other output terminal is connected to the reset terminal of a counter 56.

The PWM generator 50 includes a comparator 58. One input terminal of the comparator 58 is connected to the output terminal of the corresponding buffer 14, so that the N-bit image data 40A of the PWM data 40 stored in that buffer 14 is inputted to the comparator 58. The other input terminal of the comparator 58 is connected to the output terminal of the counter 56 that outputs the counted value. Accordingly, the comparator 58 compares the image data 40A and the counted value counted by the counter 56.

Figure 9:
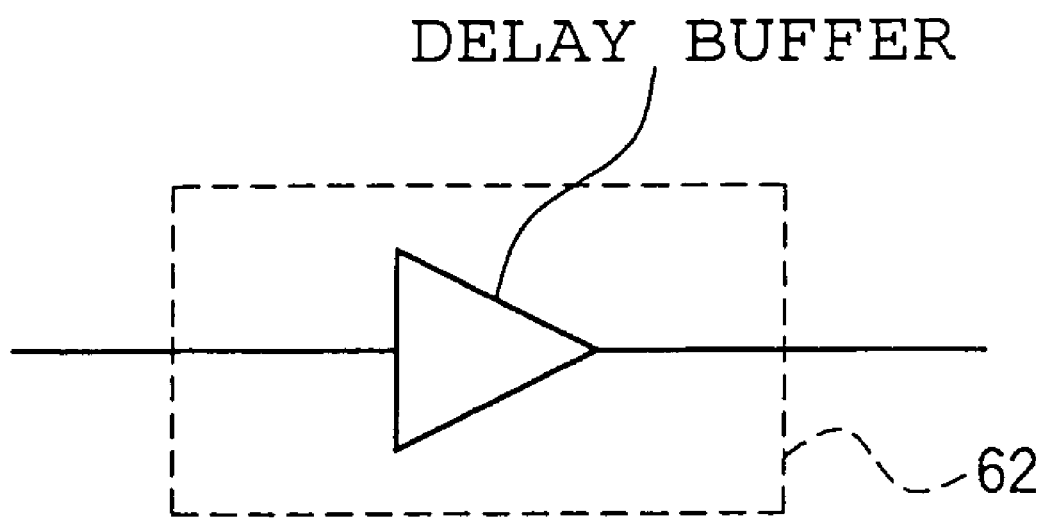
FIG. 9 is a circuit diagram illustrating an example of a structure of a delay circuit of the PWM generator relating to the first embodiment.

The PWM generator 50 is provided with a reference clock generator 60 which generates and outputs a reference clock CLK0 which is a reference for the output timing of the PWM signal. The output terminal of the reference clock generator 60 is connected to the input terminal of a delay circuit 62 which outputs a delay clock CLK1 which is later than the reference clock CLK0 by a predetermined period of time which is shorter than one period of the reference clock CLK0 (in the present embodiment, this predetermined period of time corresponds to one-half of one period of the reference clock CLK0). The delay circuit 62 relating to the present embodiment is structured by a delay buffer such as that illustrated in FIG. 9.

The output terminal of the reference clock generator 60 is split, and is connected to a pulse input terminal of the counter 56 as well as to one input terminal of a two-input/ one-output AND gate 64A. Accordingly, the number of pulses of the reference clock CLK0 is counted by the counter 56. Further, the output terminal of the delay circuit 62 is connected to one input terminal of a two-input/one-output AND gate 64B.

The respective other input terminals of the AND gates 64A and 64B are connected to the output terminal of the comparator 58. The respective output terminals of the AND gates 64A and 64B are connected to the input terminals of a two-input/one-output selector 66. The output terminal of the selector 66 is connected to the reset terminal (R terminal) of the R-S flip-flop 54.

The selection signal input terminal of the selector 66 is connected to the output terminal of a 1-bit decoder 68. The input terminal of the 1-bit decoder 68 is connected to the buffer 14 such that the delay selection data 40B is inputted to the 1-bit decoder 68. At the 1-bit decoder 68, the delay selection data 40B inputted from the buffer 14 is decoded, and is inputted to the selection signal input terminal of the selector 66 as clock selection signal 36. At the selector 66, when the clock selection signal 36 which has been inputted to the selection signal input terminal thereof represents 0, the input terminal which is connected to the output terminal of the AND gate 64A is selected. When the clock selection signal 36 represents 1, the input terminal connected to the output terminal of the AND gate 64B is selected.

The PWM generator 50 corresponds to the pulse width modulating device of the present invention. The R-S flip-flop 54 corresponds to the pulse width modulating signal outputting device of the present invention. The reference clock generator 60 corresponds to the clock generating device of the present invention, and the delay circuit 62 corresponds to the delay device of the present invention. The controller 202 and the light source portion 204 for full color image formation correspond to the exposure device of the present invention, and the light source portion 204 for full color image formation corresponds to the light source of the present invention.

Reservoir Section

A reservoir section 170 (see FIG. 3) is disposed between the exposure section 176 and the water application section 178, which were described previously, and is formed by two nip roller pairs 192, 194 and one dancer roller 196. The photosensitive material 106 is trained about the two nip roller pairs 192, 196 and goes slack in a substantially-U shape in the region therebetween. The dancer roller 196 moves vertically in accordance with this slack so as to adjust the slack in the photosensitive material 106.

The photosensitive material 106 is step-moved at the exposure section 176, but in the water application section 178, must be conveyed at a constant speed in order for the water to be applied uniformly. Thus, a difference in conveying speeds of the photosensitive material 106 arises between the exposure section 176 and the water application section 178. In order to absorb this difference in speeds, the dancer roller 196 moves vertically so as to adjust the amount of slack in the photosensitive material 106. In this way, the photosensitive material 106 can simultaneously be step-moved and moved at a constant speed.

Operation

Operation of the present embodiment will be described hereinafter. First, the overall flow of processes for image recording will be described.

The tray 144 is loaded into the tray loading opening 146. The supply reel 152, around which the photosensitive material 106 is wound, and the empty take-up reel 154 are loaded at respective predetermined positions. When this loading has been completed, if a print start key of the operation display section 112 is operated, at the controller 202, image data is read from the CD-ROM 102 or the FD 104. The read image data is divided into data for the respective LED chips by the data separator 12, and the delay selection data 40B is added to each of these divisional image data 40A. Thereafter, the data are stored in the respective buffers 14.

At the controller 202, when the image data 40A and the delay selection data 40B, i.e., the PWM data 40, are stored, the supply reel 152 is driven so that conveying of the photosensitive material 106 begins.

When the photosensitive material 106 reaches a predetermined position of the exposure section 176, the photosensitive material 106 is temporarily stopped. PWM signals 48 of pulse widths corresponding to the image data 40A are outputted to the light source portion 204 for full color image formation from the PWM generators 50 provided in the controller 202 in correspondence with the respective LED chips 208. The PWM signals 48 are outputted for the eleven lines. The light source portion 204 for full color image formation is guided by the guide shafts 218 and moves along the transverse direction of the photosensitive material 106 (main scanning) due to the driving of the stepping motor 226.

Before the output of the PWM signals 48 begins, the light amounts of the respective colors from the light source portion 204 for full color image formation are detected by the photodiode 228. At the light amount correction unit 230, the correction values for adjusting the light amounts, the color balance, and the like are supplied to the CPU 10 of the controller 202, and the respective image data 40A are corrected. This correction is carried out per image.

As illustrated in FIG. 6, when one main scan is completed, the photosensitive material 106 is moved by one step (a 5.5 line pitch) and stopped, and the second main scan is carried out. By repeating these processes, an image of one frame is recorded on the photosensitive material 106. Namely, main scan lines are formed at a pitch which is one-half of the pitch at which the LED chips 208 are arranged, and thus, the resolution is improved. In this case, exposure should not be carried out (i.e., the LED chips 208 should not be lit) for the top five lines on the image during the initial main scanning driving, and for the bottom five lines during the final main scanning driving.

Due to the driving of only the upstream side nip roller pair 192 at the reservoir section 170 (the downstream side nip roller pair 194 is stopped), the photosensitive material 106 for which recording has been completed is maintained in a slack state in the reservoir section 170 in a state of being trained around the dancer roller 196, and does not reach the water application section 178.

When a length of the photosensitive material 106 corresponding to one image has been accumulated in the reservoir section 170, the driving of the downstream side nip roller pair 194 of the reservoir section 170 begins. In this way, the photosensitive material 106 (on which an image has been recorded) is conveyed to the water application section 178. In the water application section 178, the photosensitive material 106 is conveyed at a constant speed, and water is applied uniformly thereto by the application portion 188.

Water is constantly supplied from the tank 190 to the application portion 188, and the application portion 188 is pressed against the photosensitive material 106 at a predetermined pressure. Thus, an appropriate amount of water is applied to the photosensitive material 106.

The photosensitive material 106 to which water has been applied is guided by the guide plate 172 and conveyed to the third roller pair 166.

Due to one rotation of the semicircular roller 156, the peripheral surface of the semicircular roller 156 contacts the leading end portion of the image receiving paper 108. The uppermost image receiving paper 108 is pulled out and is nipped by the first roller pair 160. Due to the driving of the first roller pair 160, the image receiving paper 108 is pulled out from the tray 144, and in a state of being nipped by the second roller pair 162, awaits the arrival of the photosensitive material 106.

Synchronously with the photosensitive material 106 passing by the guide plate 172, the driving of the first roller pair 160 and the second roller pair 162 is started. The image receiving paper 108 is guided by the guide plate 164 and is conveyed to the third roller pair 166.

The photosensitive material 106 and the image receiving paper 108 are nipped by the third roller pair 166 in a state of being superposed together, and are fed to the heat roller 174 by the third roller pair 166. At this time, due to the water applied to the photosensitive material 106, the photosensitive material 106 and the image receiving paper 108 closely contact one another.

The photosensitive material 106 and the image receiving paper 108 which are superposed together are trained around the heat roller 174 and receive the heat from the heater 182 so that heat developing transfer processing is carried out. Namely, the image recorded on the photosensitive material 106 is transferred onto the image receiving paper 108 and becomes a visible image.

The heat developing transfer is completed with the photosensitive material 106 and the image receiving paper 108 trained around about ⅓ of the circumference of the heat roller 174. The image receiving paper 108 is peeled from the photosensitive material 106 by the peeling roller 184 and the peeling claw 186, and is discharged onto the discharge tray 140 while trained around the peeling roller 184.

On the other hand, after the photosensitive material 106 has been trained around about ½ of the circumference of the heat roller 174, the photosensitive material 106 is moved in a direction tangential to the heat roller 174 and taken-up onto the take-up reel 154.

Figure 10:
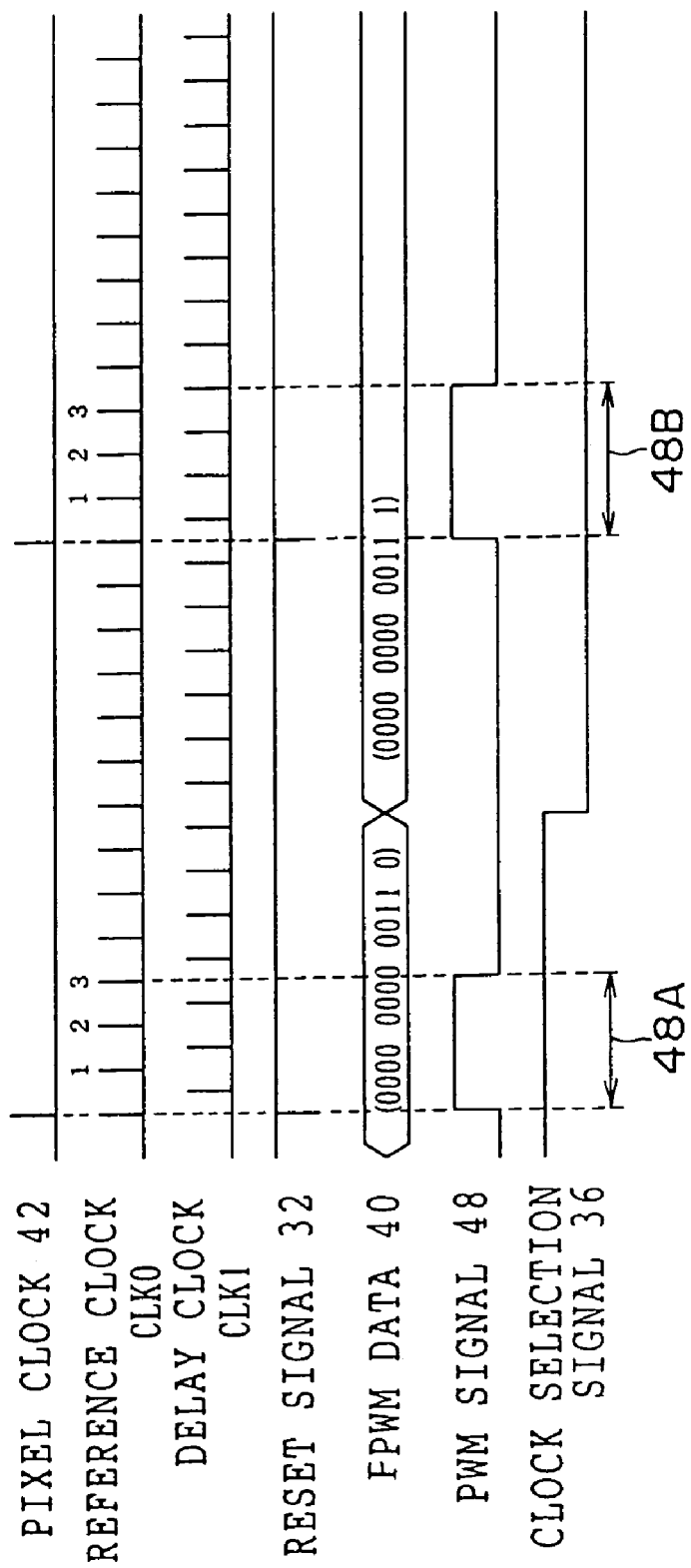
FIG. 10 is a time chart for explanation of operation of the PWM generator relating to the first embodiment.

Next, with reference to FIGS. 8 and 10, detailed description will be given of the operation at the time the PWM signal 48 for the corresponding LED chip 208 is generated by the PWM generator 50, the PWM generators 50 being provided so as to correspond to the LED chips 208 respectively. FIG. 10 is a time chart illustrating an example of changes over time in the main signal at the interior of the PWM generator 50. This explanation presupposes that the pixel clock 42 of a predetermined frequency has been inputted to the control logic 52, and that the reference clock CLK0 of a higher frequency than this predetermined frequency has been generated by the reference clock generator 60. Further, explanation will be given of a case in which 3 (the image data 40A) and 0 (the delay selection data 40B) are inputted as the PWM data 40 inputted to the PWM generator 50, and thereafter, 3 (the image data 40A) and 1 (the delay selection data 40B) are inputted as the PWM data 40.

At the control logic 52 of the PWM generator 50, a PWM start signal 30 is inputted to the S terminal of the R-S flip-flop 54 synchronously with the rise in the pixel clock 42, and a reset signal 32 is outputted to the counter 56. In this way, the Q terminal output of the R-S flip-fop 54 is high level such that the PWM signal 48 is made to rise, and the count value of the counter 56 is reset.

Thereafter, the counter 56 begins counting the number of pulses of the reference clock CLK0 inputted from the reference clock generator 60, and the counted value is outputted to the other input terminal of the comparator 58.

The image data 40A of the PWM data 40 is inputted to the one input terminal of the comparator 58. When the image data 40A and the counted value counted by the counter 56 coincide, a high-level count completion signal 34 is output from the comparator 58 and is inputted to the respective other input terminals of the AND gates 64A and 64B.

The reference clock CLK0 is inputted to the one input terminal of the AND gate 64A. The delay clock CLK1, which is later than the reference clock CLK0 by a period of time corresponding to one-half of a period of the reference clock CLK0, is inputted to the one input terminal of the AND gate 64B. The clock selection signal 36 corresponding to the delay selection data 40B is inputted by the 1-bit decoder 68 to the selection signal input terminal of the selector 66.

Accordingly, the image data 40A and the counted value counted by the counter 56 coincide, and the PWM stop signal 38 is inputted from the selector 66 to the R terminal of the R-S flip-flop 54 at a timing synchronous with the pulse of one of the reference clock CLK0 and the delay clock CLK1 selected in accordance with the clock selection signal 36. The Q terminal output of the R-S flip-flop 54 is low-level and the PWM signal 48 is made to fall.

Namely, in this case, initially, 3 is inputted as the image data 40A and 0 is inputted as the delay selection data 40B. Therefore, after the PWM signal 48 rises synchronously with the pixel clock 42, the counting of the three pulses of the reference clock CLK0 by the counter 56 is completed, and the PWM signal 48 falls at a timing synchronous with the reference clock CLK0. Next, when 3 is inputted as the image data 40A and 1 is inputted as the delay selection data 40B, after the PWM signal 48 rises synchronously with the pixel clock 42, the counting of the three pulses of the reference clock CLK0 by the counter 56 is completed, and the PWM signal 48 falls at a timing synchronous with the delay clock CLK1.

Accordingly, a pulse width 48B of the PWM signal 48 in the case in which 1 is set as the delay selection data 40B is longer, by a time corresponding to one-half of a period of the reference clock CLK0, than a pulse width 48A of the PWM signal 48 in the case in which 0 is set as the delay selection data 40B. Namely, in the case in which 1 is set as the delay selection data 40B, a bit resolution can be obtained which is double the bit resolution of that in a case in which the PWM signal 48 is made to fall by the reference clock CLK0.

The above operations are carried out by the respective PWM generators 50 provided in correspondence with the respective LED chips 208. Exposure, by the LED chips 208, of the first pixels, in the main scanning direction, of eleven lines onto the photosensitive material 106 is thereby carried out.

Thereafter, by generating, in the same way as described above, PWM signals 48 corresponding to the image data for the second pixels in the main scanning direction and pixels thereafter, exposure corresponding to all of the image data is carried out.

As described in detail above, in the PWM generator 50 serving as the pulse width modulating device relating to the present first embodiment, the reference clock is delayed by a time corresponding to one-half of a period of the reference clock, each pulse of the PWM signal is made to rise synchronously with the reference clock, and each pulse of the PWM signal is made to fall synchronously with the delayed reference clock (the delay clock). Therefore, the bit resolution of the PWM signal can be increased. Accordingly, exposure time of the light source portion for full color image formation, which serves as the light source for exposure, can be made more accurate.

In the present first embodiment, a case is described in which the first delay circuit 62 is used as the delay device of the present invention, and the delay clock CLK1, which delays the reference clock CLK0 by one-half of a period, is utilized. However, the present invention is not limited to the same, and plural delay circuits may be used as the delay device of the present invention.

Figure 11:
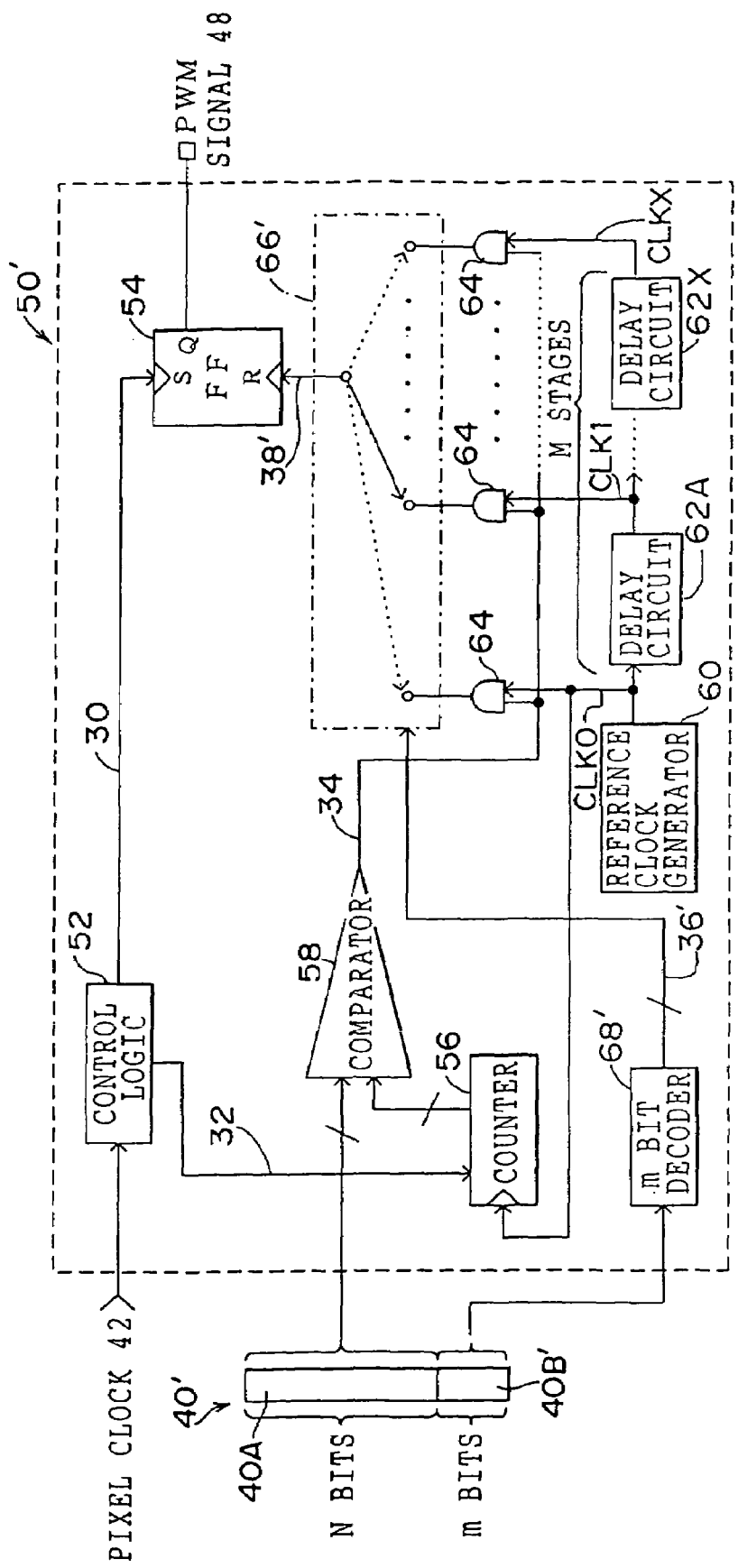
FIG. 11 is a block diagram illustrating a structural example of a PWM generator relating to the first embodiment.

FIG. 11 illustrates a structural example of a PWM generator 50' in such a case. Portions in FIG. 10 having the same functions as in FIG. 8 are denoted by the same reference numerals.

As illustrated in FIG. 10, the PWM generator 50' is provided with a plurality of delay circuits 62A through 62X. (In FIG. 10, there are M delay circuits.) The same number of AND gates 64 as delay circuits is provided. In place of the selector 66 in FIG. 8, a selector 66', which has the same number of input terminals as there are delay circuits, is used.

In place of the delay selection data 40B used in the present first embodiment which has a 1-bit structure, delay selection data 40B' which has a bit structure corresponding to the number of delay circuits (i.e., which has an m-bit structure) is used. In addition, an m-bit decoder 68' is used instead of the 1-bit decoder 68 of the present first embodiment.

The plural delay circuits 62A through 62X are connected in series. The total of the delay times caused by the respective delay circuits is shorter than one period of the reference clock CLK0.

The PWM generator 50' corresponds to the pulse width modulating device of the second aspect of the present invention, and the delay circuits 62A through 62X correspond to the plurality of delay device of the second aspect.

At the PWM generator 50' having the above-described structure, one of the delay clocks from among the delay clocks CLK1 through CLKX, which are outputted from the delay circuits in correspondence with the values set at the delay selection data 40B', can be selectively used. Therefore, as compared with a case in which only one delay circuit is provided, the bit resolution of the PWM signal 48 can be improved even more.

Figure 12:
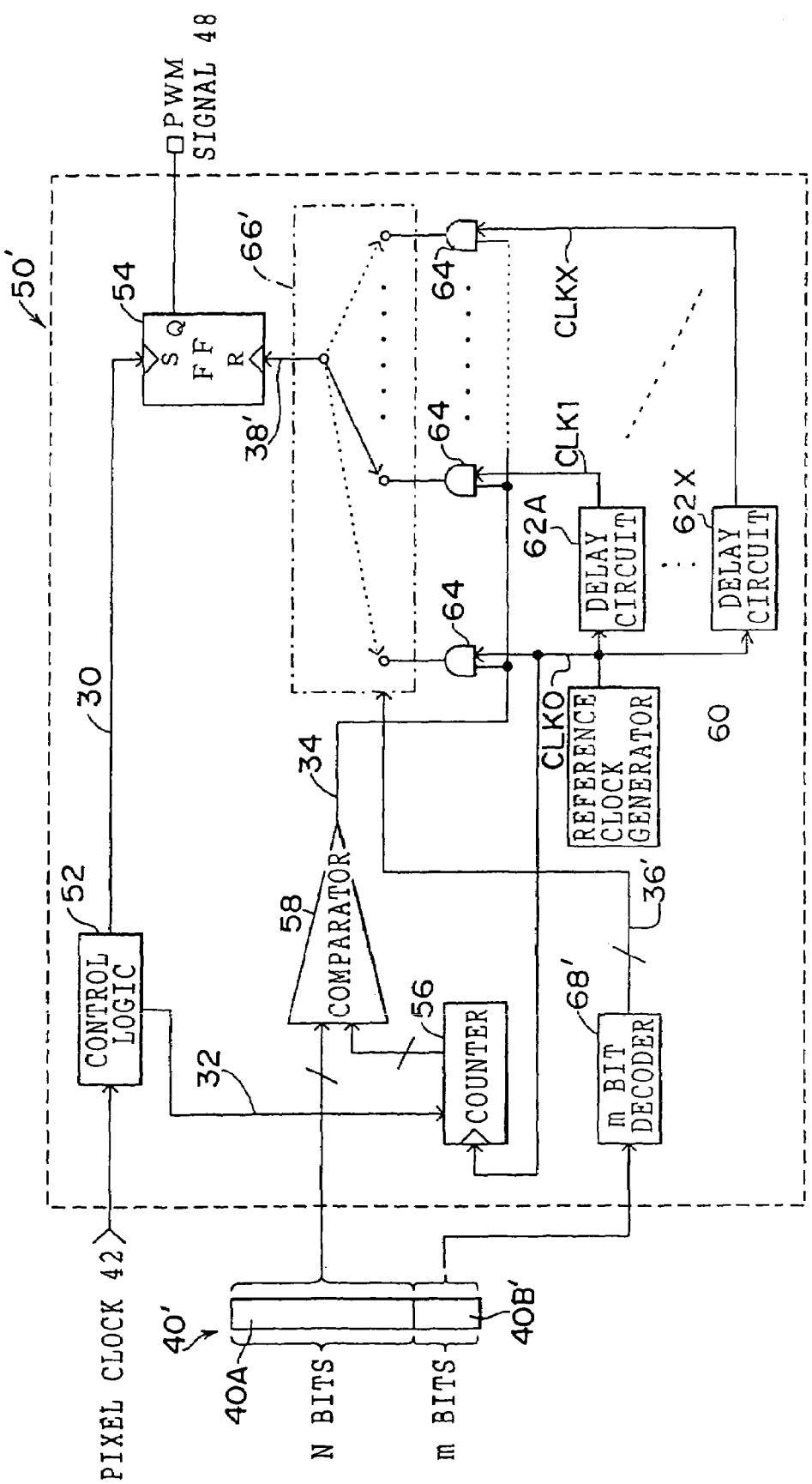
FIG. 12 is a block diagram illustrating another structural example of a PWM generator relating to the first embodiment.

Further, as a modified example, the plurality of delay circuits 62A through 62X can be connected in parallel as illustrated in FIG. 12. In this case, the delay times of the delay circuits 62A through 62X are respectively different. The delay times of the delay circuits are shorter than one period of the reference clock CLK0.

In this case as well, in the same way as the PWM generator 50' illustrated in FIG. 11, any of the delays clocks CLK1 through CLKX outputted from the delay circuits in accordance with the values set in the delay selection data 40B' can be selectively used. Thus, as compared with a case in which only one delay circuit is provided, the bit resolution of the PWM signal 48 can be improved even more.

In the present first embodiment, a case is described in which the PWM signal is made to rise synchronously with the reference clock CLK0 and the PWM signal is made to fall synchronously with the delay clock CLK1. However, the present invention is not limited to the same. The same effects as those of the present first embodiment can be achieved even if the PWM signal is made to rise synchronously with the delay clock CLK1 and the PWM signal is made to fall synchronously with the reference clock CLK0.

Further, the structures illustrated in FIGS. 8, 11 and 12 are merely examples, and structures which operate similarly to the portions illustrated in these figures may of course be used instead.

Second Embodiment

In the present second embodiment, an embodiment of the third aspect of the present invention will be described. Structures other than the PWM generator of the second embodiment are the same as those of the first embodiment, and description thereof is omitted.

First, with reference to FIG. 13, the structure of a PWM generator 50" relating to the present second embodiment will be described. Portions in FIG. 13 which are the same as those in FIG. 8 are denoted by the same reference numerals, and description thereof is omitted.

Figure 13:
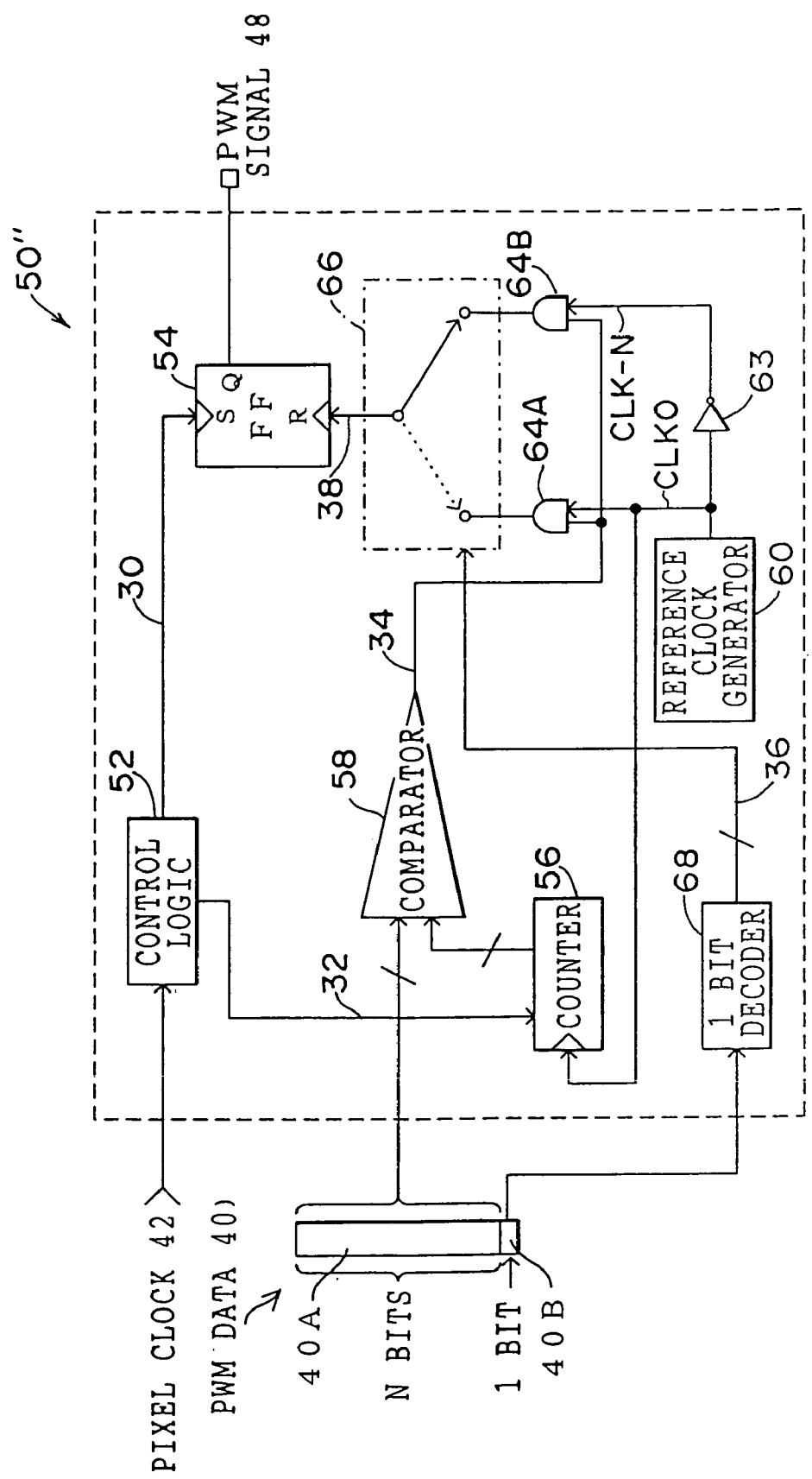
FIG. 13 is a block diagram illustrating a PWM generator relating to a second embodiment of the present invention.

As illustrated in FIG. 13, the PWM generator 50" relating to the present second embodiment differs from the PWM generator 50 relating to the first embodiment in that, instead of the delay circuit 62, an inverting circuit 63 is used. Accordingly, an inverted clock CLK-N, which is the reference clock CLK0 which has been inverted, is outputted from the inverting circuit 63.

The PWM generator 50" corresponds to the pulse width modulating device of the present invention, and the inverting circuit 63 corresponds to the inventing device of the present invention. The reference clock CLK0 may have a rectangular waveform. Further, the inverted clock CLK-N generated by the inverting circuit 63 may be delayed. Moreover, after the reference clock CLK0 is delayed, the inverted clock may be generated by the inverting circuit 63.

Operation

Figure 14:
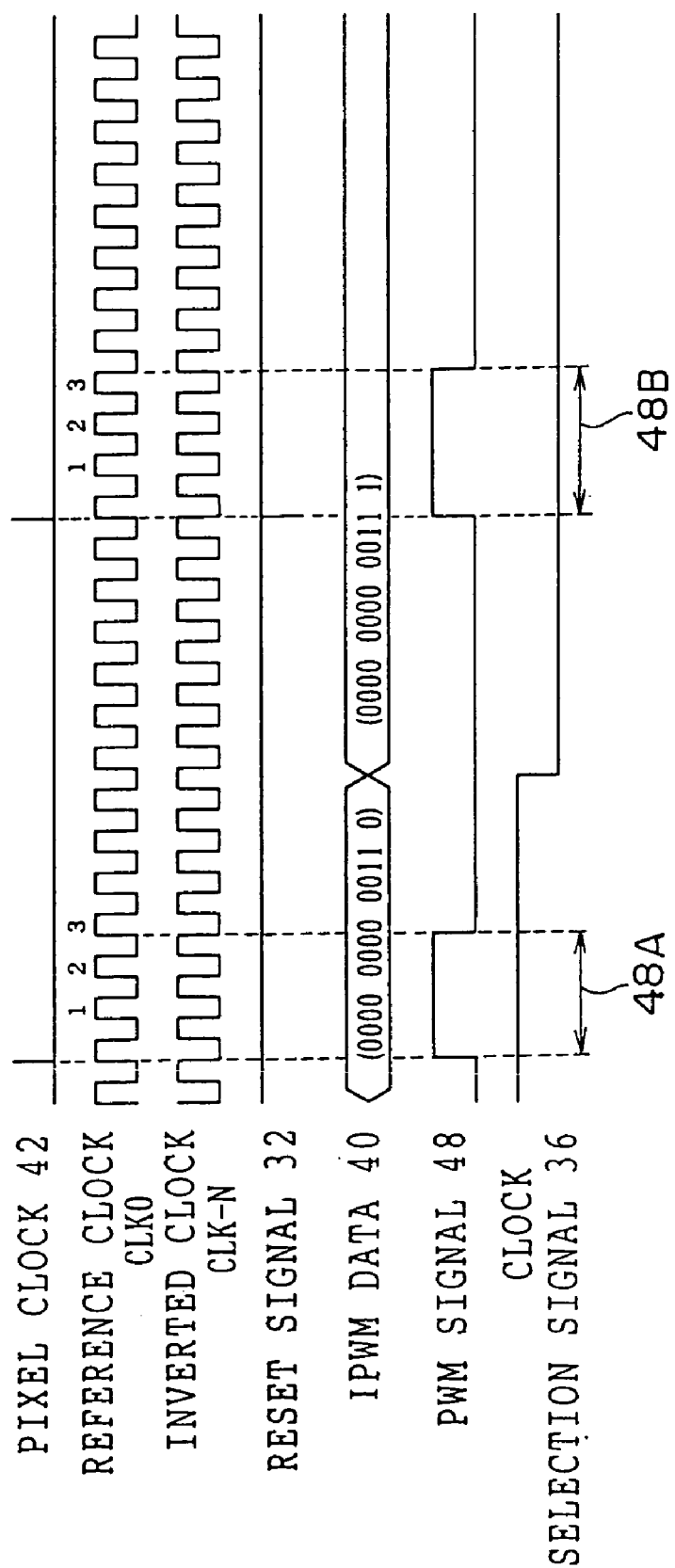
FIG. 14 is a time chart for explanation of operation of the PWM generator relating to the second embodiment.

Next, operation at the time the PWM signal 48 for the corresponding LED chip 208 is generated by the PWM generator 50" (wherein the PWM generators 50" are provided in correspondence with the LED chips 208) will be described in detail hereinafter with reference to FIGS. 13 and 14. FIG. 14 is a time chart illustrating an example of changes over time in the main signal at the interior of the PWM generator 50". In the same way as in the above-described first embodiment, a case is described in which the pixel clock 42 of a predetermined frequency has been inputted to the control logic 52, and the reference clock CLK0 of a higher frequency than this predetermined frequency has been generated by the reference clock generator 60, and 3 (the image data 40A) and 0 (the delay selection data 40B) are inputted as the PWM data 40 inputted to the PWM generator 50", and thereafter, 3 (the image data 40A) and 1 (the delay selection data 40B) are inputted as the PWM data 40. Further, here, a case is described in which the reference clock CLK0 is a pulse signal having a duty ratio of 50%.

At the control logic 52 of the PWM generator 50", the PWM start signal 30 is inputted to the S terminal of the R-S flip-flop 54 synchronously with the rise in the pixel clock 42, and the reset signal 32 is outputted to the counter 56. In this way, the Q terminal output of the R-S flip-flop 54 is high level such that the PWM signal 48 is made to rise, and the count value of the counter 56 is reset. Thereafter, the counter 56 begins counting the number of pulses of the reference clock CLK0 inputted from the reference clock generator 60, and the counted value is outputted to the other input terminal of the comparator 58.

The image data 40A of the PWM data 40 is inputted to the one input terminal of the comparator 58. When the image data 40A and the counted value counted by the counter 56 coincide, the high-level count completion signal 34 is output from the comparator 58 and is inputted to the respective other input terminals of the AND gates 64A and 64B.

The reference clock CLK0 is inputted to the one input terminal of the AND gate 64A. The inverted clock CLK-N, which is the reference clock CLK0 which has been inverted, is inputted to the one input terminal of the AND gate 64B. The clock selection signal 36 corresponding to the delay selection data 40B is inputted by the 1-bit decoder 68 to the selection signal input terminal of the selector 66.

Accordingly, the image data 40A and the counted value counted by the counter 56 coincide, and at a timing synchronous with the pulse of one of the reference clock CLK0 and the inverted clock CLK-N selected in accordance with the clock selection signal 36, the PWM stop signal 38 is inputted to the R terminal of the R-S flip-flop 54. The Q terminal output of the R-S flip-flop 54 is low-level, and the PWM signal 48 is made to fall.

Namely, in this case, initially, 3 is inputted as the image data 40A and 0 is inputted as the delay selection data 40B. Therefore, after the PWM signal 48 rises synchronously with the pixel clock 42, the counting of the three pulses of the reference clock CLK0 by the counter 56 is completed, and the PWM signal 48 falls at a timing synchronous with the reference clock CLK0. Next, when 3 is inputted as the image data 40A and 1 is inputted as the delay selection data 40B, after the PWM signal 48 rises synchronously with the pixel clock 42, the counting of the three pulses of the reference clock CLK0 by the counter 56 is completed, and the PWM signal 48 falls at a timing synchronous with the inverted clock CLK-N.

Accordingly, the pulse width 48B of the PWM signal 48 in the case in which 1 is set as the delay selection data 40B is longer, by a time corresponding to one-half of a period of the reference clock CLK0, than the pulse width 48A of the PWM signal 48 in the case in which 0 is set as the delay selection data 40B. Namely, in the case in which 1 is set as the delay selection data 40B, a bit resolution can be obtained which is double the bit resolution of that in a case in which the PWM signal 48 is made to fall by the reference clock CLK0.

As described above, in the PWM generator 50" serving as the pulse width modulating device relating to the present second embodiment, the reference clock is inverted, the respective pulses of the PWM signal are made to rise synchronously with the reference clock, and the respective pulses of the PWM signal are made to fall synchronously with the inverted reference clock (i.e., the inverted clock). Therefore, the bit resolution of the PWM signal can be improved. Accordingly, exposure time of the light source portion for full color image formation, which serves as the light source for exposure, can be made more accurate.

Figure 15:
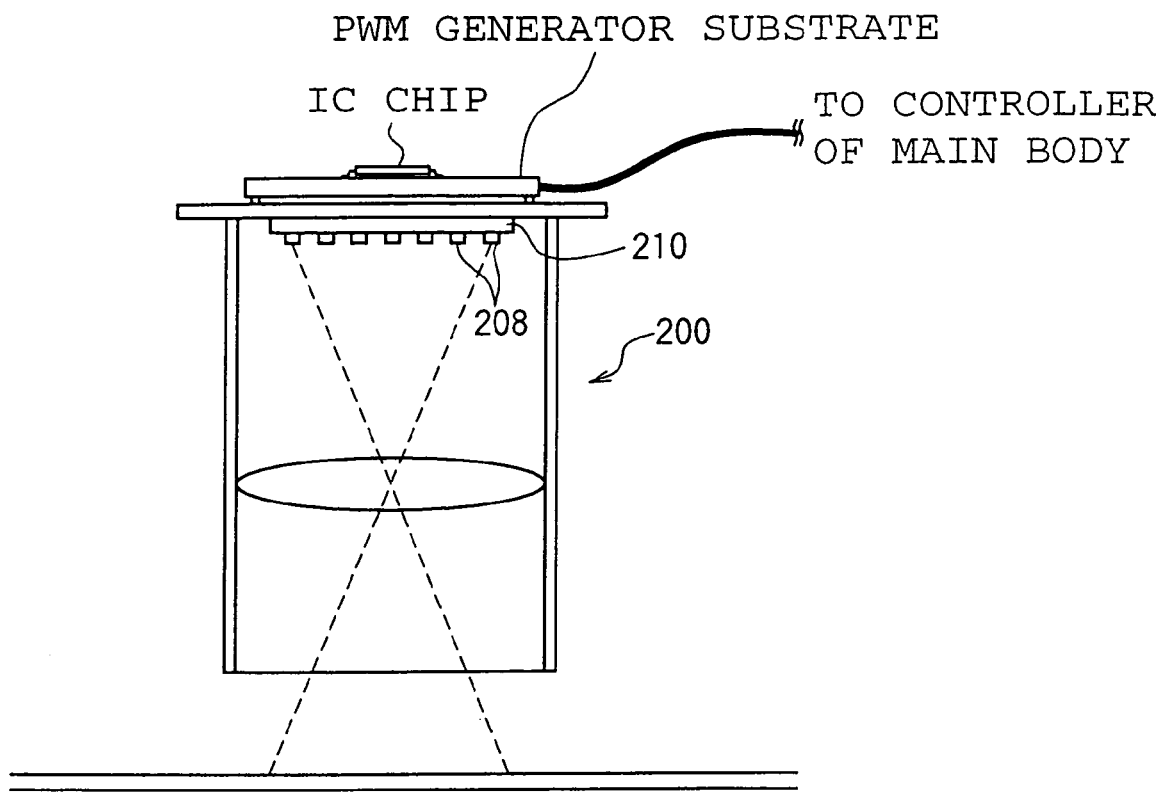
FIG. 15 is a front view illustrating a schematic structure of an exposure section used in the description of the effects of the respective embodiments.
Figure 16:
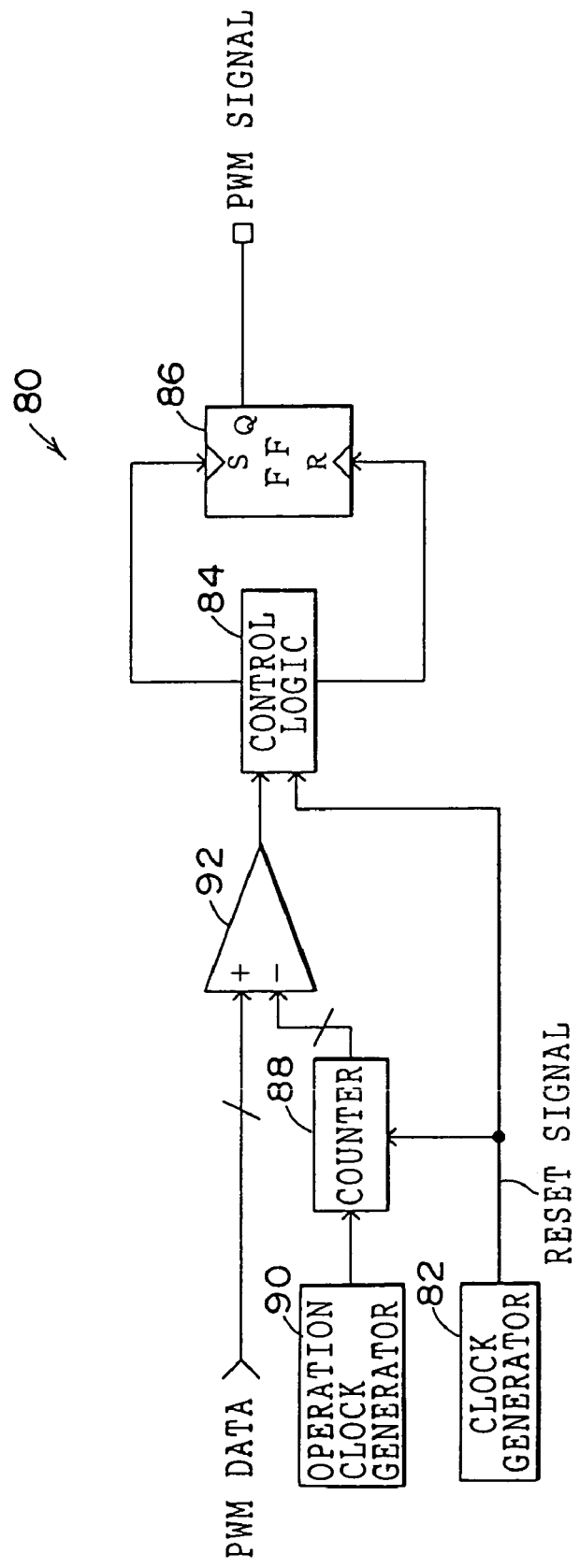
FIG. 16 is a block diagram illustrating the structure of a conventional pulse width modulating device.

Further, the PWM generator serving as the pulse width modulating device relating to the above-described embodiments can be structured as an IC chip such as a gate array. Thus, as shown in FIG. 15 as an example, a PWM generator substrate on which an IC chip is provided may be mounted to the substrate 210 at which the LED chips 208 of the light source unit 200 are provided. In this way, the device can be made more compact and more reliable.

In the present second embodiment, description is given of a case in which the duty ratio of the reference clock CLK0 is 50%. However, the present invention is not limited to the same. The present invention may be applied regardless of the duty ratio of the reference clock CLK0.

In the present second embodiment, description is given of a case in which the PWM signal is made to rise synchronously with the reference clock CLK0, and the PWM signal is made to fall synchronously with the inverted clock CLK-N. However, the present invention is not limited to the same. The same effects as the present second embodiment are achieved even if the PWM signal is made to rise synchronously with the inverted clock CLK-N and the PWM signal is made to fall synchronously with the reference clock CLK0.

Further, the structure illustrated in FIG. 13 is merely one example, and structures which operate similarly to the portions illustrated in this figure may of course be used instead.

In accordance with the pulse width modulating device of the first aspect, the pulses of a pulse width modulating signal are made to rise synchronously with one of a clock signal and a clock signal which has been delayed by a delay device, and the pulses of the pulse width modulating signal are made to fall synchronously with the other of the clock signal and the clock signal delayed by the delay device. Thus, a superior effect is achieved in that the bit resolution of the pulse width modulating signal can be improved over a case in which the rising and falling of pulses is effected on the basis of the clock signal alone.

In accordance with the pulse width modulating device of the second aspect, the pulses of a pulse width modulating signal are made to rise synchronously with one of a clock signal and a plurality of clock signals which are delayed by respective delay device whose respective delay times become gradually longer. The pulses of the pulse width modulating signal are made to fall synchronously with a remaining one of the clock signal and the delayed clock signals. Thus, an excellent effect can be achieved in that the bit resolution of the pulse width modulating signal can be improved as compared to a case in which a single delayed clock signal is generated by a single delay device.

In accordance with the pulse width modulating device of the third aspect, the pulses of a pulse width modulating signal are made to rise synchronously with one of a clock signal and a clock signal which has been inverted by an inverting device. The pulses of the pulse width modulating signal are made to fall synchronously with the other of the clock signal and the clock signal inverted by the inverting device. Thus, as compared with a case in which rising and falling of the pulses is carried out only on the basis of a clock signal, an excellent effect is achieved in that the bit resolution of the pulse width modulating signal can be improved.

The exposure device of the fourth aspect is provided with the pulse width modulating device of the present invention which enables an improvement in the bit resolution of the pulse width modulating signal. The light source for exposure emits light in accordance with the pulse width of the respective pulses of the pulse width modulating signal outputted from the pulse width modulating signal output device provided at the pulse width modulating device. Thus, the exposure time of the light source can be made more accurate.

What is claimed is:

1. A pulse width modulating device comprising:
   a clock generating device which generates a first clock signal;
   an operation device which operates the first clock signal and generates at least one processing clock signal whose phase is different than a phase of the first clock signal;
   a pulse width modulating signal output device which makes a pulse of a pulse width modulating signal rise synchronously with one of the first clock signal and the processing clock signal generated by said operation device, and makes the pulse of the pulse width modulating signal fall synchronously with a remaining one of the first clock signal and the processing clock signal generated by said operation device; and
   a counter which, after the pulse of the pulse width modulating signal is made to rise, counts a number of pulses of the remaining one of the first clock signal and the processing clock signal generated by said operation device,
   wherein after said counter has counted a predetermined number of pulses, said pulse width modulating signal output device makes the pulse fall synchronously with the remaining one of the first clock signal and the processing clock signal generated by said operation device.

2. A pulse width modulating method comprising
   (a) generating a first clock signal;
   (b) operating the first clock signal and generating at least one clock signal whose phase is different than a phase of the first clock signal;
   (c) making a pulse of a pulse width modulating signal rise synchronously with one of the first clock signal and the clock signal generated in step (b), and making the pulse of the pulse width modulating signal fall synchronously with a remaining one of the first clock signal and the clock signal generated in step (b); and
   (d) in step (c), after the pulse is made to rise, counting a number of pulses of the remaining one of the first clock signal and the clock signal generated in step (b),
   wherein in step (c), after a predetermined number of pulses have been counted by step (d), the pulse is made to fall synchronously with the remaining one of the first clock signal and the clock signal generated in step (b).

3. A pulse width modulating device comprising:
   a clock generating device which generates a first clock signal;
   an operation device which operates the first clock signal and generates at least one processing clock signal whose phase is different than a phase of the first clock signal;
   a pulse width modulating signal output device which makes a pulse of a pulse width modulating signal rise synchronously with one of the first clock signal and the processing clock signal generated by said operation device, and makes the pulse of the pulse width modulating signal fall synchronously with a remaining one of the first clock signal and the processing clock signal generated by said operation device; and a selector which selects and outputs to the pulse width modulating signal output device one of the first clock signal and the processing clock signal, based on a clock selection signal input to the selector.

4. An exposure device, comprising:

(a) a pulse width modulating device including:

(i) a clock generating device which generates a first clock signal;

(ii) an operation device which operates the first clock signal and generates at least one processing clock signal whose phase is different than a phase of the first clock signal; and (iii) a pulse width modulating signal output device which makes a pulse of a pulse width modulating signal rise synchronously with one of the first clock signal and the processing clock signal generated by said operation device, and makes the pulse of the pulse width modulating signal fall synchronously with a remaining one of the first clock signal and the processing clock signal generated by said operation device; and (b) a light source for exposure which emits light in accordance with a pulse width of respective pulses of the pulse width modulating signal outputted by said pulse width modulating signal outputting device provided at said pulse width modulating device; and a selector which selects and outputs to the pulse width modulating signal output device one of the first clock signal and the processing clock signal, based on a clock selection signal input to the selector.

* * * * *